United States Patent
Matsui et al.

(10) Patent No.: US 12,125,926 B2
(45) Date of Patent: Oct. 22, 2024

(54) SEMICONDUCTOR DEVICE AND SOLAR CELL AND PRODUCTION METHOD FOR SEMICONDUCTOR DEVICE

(71) Applicant: National Institute of Advanced Industrial Science and Technology, Tokyo (JP)

(72) Inventors: Takuya Matsui, Ibaraki (JP); Hitoshi Sai, Ibaraki (JP)

(73) Assignee: National institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 17/626,424

(22) PCT Filed: Jun. 25, 2020

(86) PCT No.: PCT/JP2020/025060
§ 371 (c)(1),
(2) Date: Jan. 11, 2022

(87) PCT Pub. No.: WO2021/010127
PCT Pub. Date: Jan. 21, 2021

(65) Prior Publication Data
US 2022/0262964 A1 Aug. 18, 2022

(30) Foreign Application Priority Data
Jul. 12, 2019 (JP) .................. 2019-130576

(51) Int. Cl.
*H01L 31/0236* (2006.01)
*H01L 31/075* (2012.01)
*H01L 31/18* (2006.01)

(52) U.S. Cl.
CPC ...... *H01L 31/02363* (2013.01); *H01L 31/075* (2013.01); *H01L 31/1804* (2013.01)

(58) Field of Classification Search
None
See application file for complete search history.

(56) References Cited

U.S. PATENT DOCUMENTS

| 2015/0034159 | A1* | 2/2015 | Avasthi | H01L 31/022475 438/94 |
| 2015/0059842 | A1* | 3/2015 | Bae | H01L 31/1884 136/256 |
| 2018/0013021 | A1* | 1/2018 | Kai | H01L 31/022441 |

FOREIGN PATENT DOCUMENTS

CN 103081120 A 5/2013

OTHER PUBLICATIONS

Bhatia "Room temperature H2 plasma treatment for enhanced passivation of silicon/TiO2 interface", Applied Physics Letters, 113, All Pages. (Year: 2018).*

(Continued)

*Primary Examiner* — Daniel P Malley, Jr.
(74) *Attorney, Agent, or Firm* — Shih IP Law Group, PLLC

(57) ABSTRACT

The present invention realizes a hole-selective film provided with both hole selectivity and passivation characteristics. This production method for a semiconductor device is provided with a step for forming a titanium oxide film on a crystalline silicon layer by means of a thermal atomic layer deposition method, and a step for carrying out a hydrogen plasma process on the titanium oxide film.

20 Claims, 15 Drawing Sheets

(56) References Cited

OTHER PUBLICATIONS

Bhatia "Room temperature H2 plasma treatment for enhanced passivation of silicon/TiO2 interface", Appl. Phys. Lett. 133, All Pages, 2018. (Year: 2018).*

Matsui et al. "Atomic-Layer-Deposited TiOx Nanolayers Function as Efficient Hole-Selective Passivating Contacts in Silicon Solar Cells", ACS Appl. Mater. Interfaces 12, 2020, All Pages. (Year: 2020).*

Bhatia et al., "Room temperature H2 plasma treatment for enhanced passivation of silicon/TiO2", Applied Physics Letters, 113, All Pages, Oct. 24, 2018. (Year: 2018).*

International Search Report from International Application No. PCT/JP2020/025060 mailed Aug. 25, 2020.

T. Matsui et al., "Investigation of atomic-layer-deposited TiOx as selective electron and hole contacts to crystalline silicon", 7th International Conference on Silicon Photovoltaics, SiliconPV 2017, Energy Procedia 124 (2017) 628.

Y. W. Chen et al., "Atomic layer-deposited tunnel oxide stabilizes silicon photoanodes for water oxidation" Nature Materials 10 (2011) 539.

S. Hu et al., "Amorphous TiO2 coatings stabilize Si, GaAs, and GaP photoanodes for efficient water oxidation" Science 344 (2014) 6187.

C. Battaglia et al., "Hole Selective MoOx Contact for Silicon Solar Cells" Nano Letters 14 (2014) 967.

J. Bullock et al., "n- and p-type silicon solar cells with molybdenum oxide hole contacts" 5th International Conference on Silicon Photovoltaics, SiliconPV 2015, Energy Procedia 77 (2015) 446.

L.G. Gerling et al., "Transition metal oxides as hole-selective contacts in silicon heterojunctions solar cells" Solar Energy Materials & Solar Cells, 145 (2016) 109.

L.G. Gerling et al., "Passivating/hole-selective contacts based on V2O5/SiOx stacks deposited at ambient temperature" 7th International Conference on Silicon Photovoltaics, SiliconPV 2017, Energy Procedia 124 (2017) 584.

M. Bivour et al., "Molybdenum and tungsten oxide: High work function wide band gap contact materials for hole selective contacts of silicon solar cells" Solar Energy Materials & Solar Cells 142 (2015) 34-41.

X. Yang et al., "High-Performance TiO 2-Based Electron-Selective Contacts for Crystalline Silicon Solar Cells" Advanced Materials 28 (2016) 5891-5897.

A. Descoeudres et al., "The versatility of passivating carrier-selective silicon thin films for diverse high-efficiency screen-printed heterojunction-based solar cells" Prog Photovolt Res Appl. 1-9 (2019). DOI: 10.1002/pip.3227.

J. Cui et al., "Titanium oxide: A re-emerging optical and passivating material for silicon solar cells" Solar Energy Materials & Solar Cells 158 (2016) 115-121.

Bhatia, Swasti et al., "Room temperature H2 plasma treatment for enhanced passivation of silicon/TiO2 interface", Applied Physics Letters, 2018, vol. 113, pp. 171603-1-171603-4.

Dwivedi, Neeraj et al., "Evidence for Chemicals Intermingling at Silicon/Titanium Oxide(TiOx) interface and Existence of Multiple Bonding States in Monolithic TiOx", Advanced Functional Materials, 2018, vol. 28, No. 1707018, pp. 1-14.

Y. Park, et al., "Work Function of Indium Tin Oxide Transparent Conductor Measured by Photoelectron Spectrocopy", Appl. Phys. Lett. 68, 2699-2701 (1996).

K. Nagamatsu, et al., Titanium dioxide/silicon hole-blocking selective contact to enable doubleheterojunction crystalline silicon-based solar cell,Applied Physics Letters 106, 123906, 6 pages (2015).

T. Allen, et al., "Calcium contacts to n-type crystalline silicon solar cells", Prog. Photovolt: Res. Appl. 2017; 25:636-644.

S. Avasthi, et al., "Hole-blocking titanium-oxide/silicon heterojunction and its application to photovoltaics", Applied Physics Letters 102, 203901, 5 pages (2013).

T. Allen, et al, "A Low Resistance Calcium/Reduced Titania Passivated Contact for High Efficiency Crystalline Silicon Solar Cells", Adv. Energy Mater. 2017, 7, 1602606, 7 pages.

\* cited by examiner

| Sample | Ti (at. %) | O (at. %) | Si (at. %) | H (at. %) | Jsc (mA/cm²) | Voc(V) | FF | Eff. (%) |
|---|---|---|---|---|---|---|---|---|
| t-ALD+HPT Si(111) | 17.2 | 42.1 | 38.5 | 2.2 | 35.2 | 0.644 | 0.746 | 16.9 |
| t-ALD Si(111) | 17.2 | 42.7 | 39.5 | 0.6 | 34.9 | 0.551 | 0.610 | 11.7 |
| t-ALD+HPT Si(100) | 16.4 | 37.7 | 44.2 | 1.7 | 35.2 | 0.694 | 0.755 | 18.4 |
| t-ALD Si(100) | 16.7 | 40.1 | 42.1 | 1.0 | 34.8 | 0.654 | 0.636 | 14.5 |
| p-ALD Si(100) | 16.8 | 47.9 | 35.2 | <0.5 (Below detection limit) | 26.7 | 0.247 | 0.165 | 1.1 |

FIG. 11

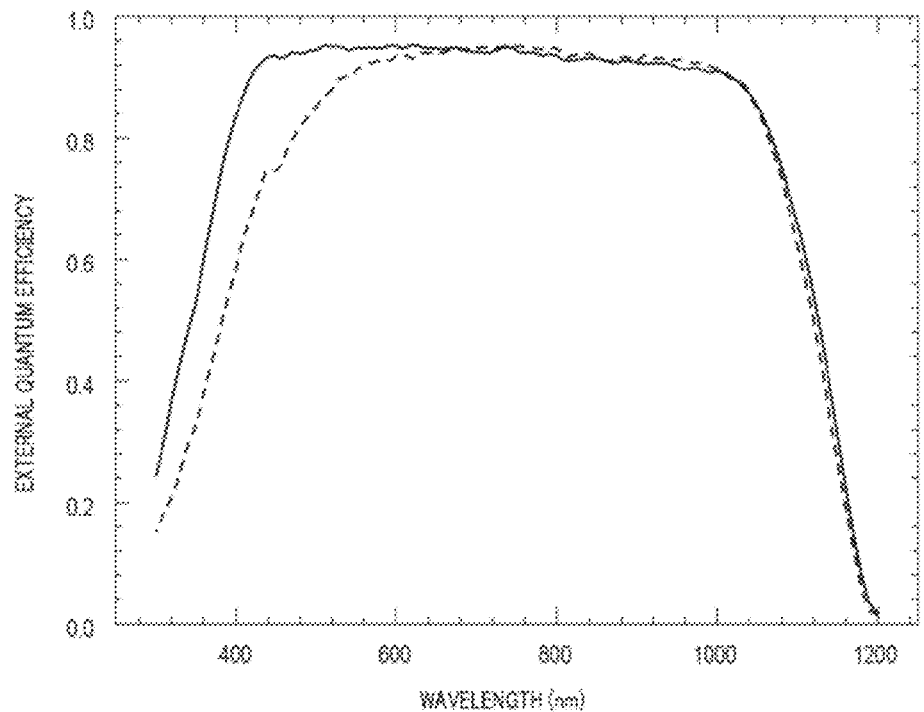

FIG. 12

| Hole passivating contacts | Function | Absorber | Depositing surface | Electron contacts | Jsc (mA/cm²) | Voc (V) | FF | Eff. (%) | ref. |
|---|---|---|---|---|---|---|---|---|---|
| SiOx (1~2 nm)/MoOx | front emitter | n | planar | SiOx/poly-Si n | 35 | 637 | 75 | 16.7 | NPL 5 |
| SiOx (1~2 nm)/V2Ox | front emitter | n | planar | a-SiH i-n | 32.5 | 662 | 70.5 | 15.1 | NPL 7 |
| SiOx (1~2 nm)/V2Ox | front emitter | n | texture | a-SiH i-n | 37.5 | 642 | 68.5 | 16.5 | NPL 7 |
| WOx | front emitter | n | planar | a-SiH i-n | ~33.5 | ~660 | ~60 | ~17.5 | NPL 8 |
| TiOx | front emitter | n | planar | a-SiH i-n | 35.2 | 694 | 75.5 | 18.4 | FIG. 1 of present application |
| TiOx | front emitter | n | texture | a-SiH i-n | 40.4 | 676 | 75.3 | 20.5 | FIG. 2 of present application |

FIG. 13

| Hole passivating contacts | Function | Absorber | Depositing surface | Electron contacts | Jsc(mA/cm²) | Voc (V) | FF | Eff. (%) |
|---|---|---|---|---|---|---|---|---|
| TiOx | FSF | p | planar | a-Si:H i-n | 34.5 | 689 | 74.6 | 17.7 |
| TiOx | FSF | p | texture | a-Si:H i-n | 38.5 | 634 | 77.4 | 18.8 |
| TiOx | BSF | p | planar | a-Si:H i-n | 33 | 650 | 77 | 16.5 |
| TiOx | BSF | p | texture | a-Si:H i-n | 38.1 | 641 | 75.4 | 18.3 |

SEMICONDUCTOR DEVICE AND SOLAR CELL AND PRODUCTION METHOD FOR SEMICONDUCTOR DEVICE

TECHNICAL FIELD

The present invention relates to a semiconductor device, a solar cell (solar battery), and a method for producing the semiconductor device, and for example, relates to methods applicable to a semiconductor device in a solar cell and to the method for producing the semiconductor device.

BACKGROUND ART

Non-Patent Literature (hereinafter, referred to as NPL) 1 describes the following: a titanium oxide film ($TiO_x$ film) formed on a buffer layer made of amorphous silicon with hydrogen added thereto functions as an electron selective film or a hole selective film depending on the production conditions and the like.

NPLs 2 and 3 describe the following: as a photoelectrode for water splitting, a titanium oxide film formed directly on a crystalline silicon layer functions as a hole selective film.

NPLs 4 to 8 describe, for example, a molybdenum oxide film ($MoO_x$ film), a vanadium oxide film ($V_2O_x$ film), or a tungsten oxide film ($WO_x$ film) as a film constituting a light transmissive hole selective film in a solar cell with crystalline silicon.

NPL 9 describes a solar cell in which a titanium oxide film formed on a crystalline silicon layer by a thermal atomic layer deposition method is used as an electron selective layer.

NPL 10 describes the following: a passivation film is used in a heterojunction solar cell, and in the passivation film, an amorphous silicon film (a-Si: H) in which hydrogen is added on a surface of a crystalline silicon layer, and an amorphous silicon nitride film (a-SiNx: H) with hydrogen added thereto are stacked in this order.

NPL 11 describes a method that uses a titanium oxide film as a passivation film formed on the light receiving surface of a crystalline silicon solar cell.

CITATION LIST

Non-Patent Literature

NPL 1
  T. Matsui et al., Energy Procedia 124 (2017) 628
NPL 2
  Y. W. Chen et al., Nature Materials 10 (2011) 539
NPL 3
  S. Hu et al., Science 344 (2014) 6187
NPL 4
  C. Battaglia et al., Nano Letters 14 (2014) 967
NPL 5
  J. Bullock et al., Energy Procedia 77 (2015) 446
NPL 6
  L. G. Gerling et al., Solar Energy Materials & Solar Cells, 145 (2016) 109
NPL 7
  L. G. Gerling et al., Energy Procedia 124 (2017) 584
NPL 8
  M. Bivour et al., Solar Energy Materials & Solar Cells 142 (2015) 34
NPL 9
  X. Yang et al., Advanced Materials 28 (2016) 5891
NPL 10
  A. Descoeudres et al., Prog Photovolt Res Appl. 1-9 (2019). DOI: 10.1002/pip.3227
NPL 11
  J. Cui et al., Solar Energy Materials & Solar Cells 158 (2016) 115

SUMMARY OF INVENTION

Technical Problem

In recent years, the development of a carrier selective film having carrier selectivity has been promoted. Specifically, examples of the carrier selective film include hole selective films that selectively allow holes to pass through and electron selective films that selectively allow electrons to pass through. In such a carrier selective film, it is desired to improve the carrier selectivity, which allows selective passing of carriers, and also to improve the passivation properties, which limits the recombination of electrons and holes at the interface between the carrier selective film and a base layer. In other words, it is desired to achieve both improved carrier selectivity and improved passivation properties at the same time for carrier selective films.

In particular, focusing on the hole selective film among the carrier selective films, no hole selective film with both suitable hole selectivity and suitable passivation properties has been obtained at the present stage. Therefore, it is particularly desirable to obtain a hole selective film that has both suitable hole selectivity and suitable passivation properties.

Other objects and novel features of the present invention will become apparent from the description herein and the accompanying drawings.

Solution to Problem

A semiconductor device in an embodiment of the present invention includes a crystalline silicon layer having a main surface, an interlayer film provided on the main surface and containing silicon, titanium and oxygen, and a titanium oxide film provided on the interlayer film. The interlayer film further contains 1.5 atomic % or more of hydrogen.

A method for producing a semiconductor device in an embodiment of the present invention includes (a) a step of forming a titanium oxide film on a crystalline silicon layer by a thermal atomic layer deposition method, and (b) a step of performing hydrogen plasma treatment on the titanium oxide film.

Advantageous Effects of Invention

The embodiment is capable of obtaining a hole selective film that has both hole selectivity and passivation properties.

BRIEF DESCRIPTION OF DRAWING

FIG. 11 is a table showing the comparison between the solar cell properties and the results of quantitative analysis of each element contained in the interlayer film by Rutherford backscattering spectroscopy (RBS) and elastic recoil detection analysis (ERDA);

FIG. 12 is a graph showing the relationship between the wavelength of incident light and external quantum efficiency;

FIG. 13 is a table showing a comparison between the present embodiment and typical examples of a front emitter solar cell of a related art in which a hole selective film is provided on the light incident surface side of a n-type crystalline silicon layer (light absorbing layer) among solar cells with hole selective films made of various materials;

DESCRIPTION OF EMBODIMENTS

Figure 1:
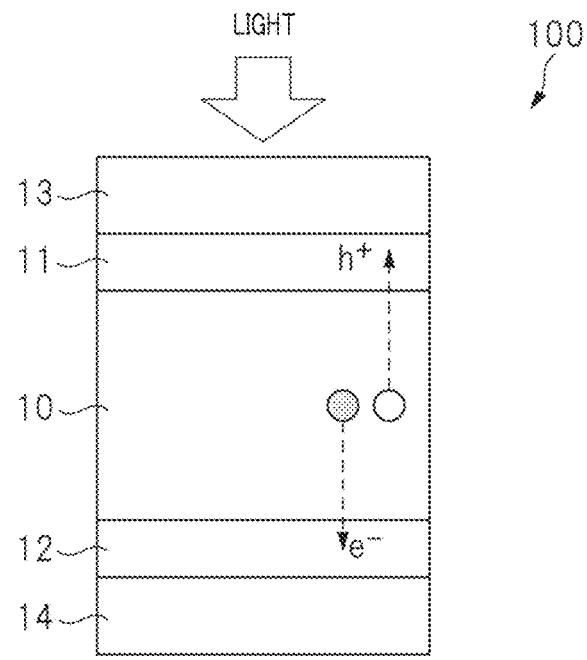
FIG. 1 illustrates a schematic device structure of a cell of a carrier selective solar cell (hereinafter simply referred to as "carrier selective solar cell," and a cell of a solar cell or solar battery is simply referred to as "solar cell")

In the following embodiments, when necessary for convenience, the description will be divided into a plurality of sections or embodiments, but unless otherwise specified, they are not unrelated to each other, but in the relation such that one is a part or all of the modifications, details, supplementary explanations, and the like of the other.

In addition, in the following embodiments, when the number or the like of elements (including the number, numerical value, quantity, and range) is referred to, the number is not limited to the specific number, and may be more than or less than the specific number unless, for example, otherwise specified or clearly limited to a specific number in principle.

Furthermore, in the following embodiments, the components (including element steps and the like) are obviously not necessarily essential unless, for example, otherwise specified or clearly considered to be essential in principle.

Similarly, in the following embodiments, when the shape, positional relationship, and the like of the components and the like are referred to, those that are similar or substantially the same in the shape and the like shall be included unless, for example, otherwise specified or considered clearly not to be the case in principle. This also applies to the above numerical value and range.

In all the drawings for explaining the embodiments, the same members are, in principle, given the same reference numerals, and the repeated description thereof will be omitted. For easier understanding of a drawing, hatching may be added even if the drawing is a plan view.

Embodiment 1

In the present embodiment 1, the technical idea relating to a carrier selective film in the present embodiment will be described by taking a carrier selective solar cell with the carrier selective film as an example.

Carrier Selective Solar Cell

In a typical solar cell, a pn junction is formed by bringing a p-type semiconductor layer into contact with an n-type semiconductor layer, and the electron-hole pairs generated by light are extracted by ohmic electrodes respectively formed on the p-type and n-type semiconductor layers. Solar cells based on such pn junction (pn homojunction) are currently the most widespread. However, the solar cell has many defects at the interface between metal and silicon due to the direct contact between the metal constituting the ohmic electrode and the silicon constituting the semiconductor layer. As a result, the electron-hole pairs generated by light are recombined via the defect level, and thus the performance of the solar cell decreases. In this solar cell, silicon is doped with a high concentration of conductive impurities in order to control the properties of the solar cell. The highly concentrated doped impurities thus cause reduction of the carrier lifetime, thereby increasing the probability of recombination. Based on the above, the conversion efficiency of solar cells using pn homojunction is limited to about 23%.

On the other hand, for example, a heterojunction solar cell in which a hydrogenated amorphous silicon (a-Si: H) and a crystalline silicon are combined currently achieves a high conversion efficiency of more than 25%. This is because amorphous silicon has excellent passivation properties that suppress the recombination of electrons and holes caused by dangling bonds (unbound hands) formed on the surface of crystalline silicon. In a heterojunction solar cell, there is no contact between the metal and crystalline silicon, thereby suppressing the recombination caused by a large number of defects formed at the interface between the metal and silicon. Furthermore, in a heterojunction solar cell, while conductive impurities are introduced into the amorphous silicon, no conductive impurities need to be introduced into the crystalline silicon, which also suppresses the reduction of the carrier lifetime caused by the conductive impurities introduced into the crystalline silicon. This means that carrier recombination in crystalline silicon is suppressed. For the above reasons, a heterojunction solar cell can obtain higher conversion efficiency than a solar cell using a pn homojunction.

However, amorphous silicon is formed by using, for example, a special high-pressure gas typically represented by silane ($SiH_4$). For this reason, capital investment and maintenance costs generally tend to increase for producing a heterojunction solar cell with amorphous silicon. In addition, the hydrogenated amorphous silicon has a property of absorbing visible light having a wavelength of 700 nm or less, and the light being absorbed by the hydrogenated amorphous silicon leads to a loss of energy conversion. There are thus obviously difficult issues to be overcome in order to improve the conversion efficiency while reducing the manufacturing cost for heterojunction solar cells.

Regarding the above issues, as a new attempt, a carrier selective solar cell including a carrier selective film that is light transmissive have been proposed as an alternative to the pn homojunction and heterojunction solar cells. This carrier selective solar cell is formed from a hole selective film and an electron selective film with a light absorber (typically a single conductive semiconductor) therebetween, and is operated as a solar cell by extracting hole current through the hole selective film and electron current through the electron selective film.

Such a carrier selective solar cell can possibly reduce the manufacturing cost of the solar cell because the solar cell may be obtained with a simple deposition method. Furthermore, many of the materials constituting a carrier selective film, namely a hole selective and electron selective films, are light transmissive in the wavelength range of sunlight, which can reduce the absorption loss of light and thus potentially improve the conversion efficiency of solar cells.

From the foregoing, the development of a carrier selective solar cell has been promoted.

What can be Improved in Carrier Selective Solar Cell

The carrier selective film is a key factor in improving the performance of a carrier selective solar cell. In other words, the carrier selective film is required to have a high ability to selectively extract carriers. For example, a hole selective film is required to have a high ability to selectively extract holes, while an electron selective film is required to have a high ability to selectively extract electrons.

In addition, the carrier selective film is required to have suitable passivation properties to suppress the recombination of electrons and holes caused by dangling bonds on the surface of the light absorber. This is because suppression of recombination can improve the conversion efficiency of a solar cell. A carrier selective film used in a carrier selective solar cell is thus required to have a high ability to selectively extract carriers and excellent passivation properties. For example, a hole selective film is required to have a high ability to selectively extract holes and excellent passivation properties. Similarly, an electron selective film is required to have a high ability to selectively extract electrons and excellent passivation properties.

Among the carrier selective films used in carrier selective solar cells, no hole selective film in particular has yet achieved both excellent passivation properties and a high ability to selectively extract holes at the present stage. For example, molybdenum oxide and vanadium oxide are attracting attention for a hole selective film, but they do not have high passivation properties, and a buffer film typically represented by an amorphous silicon film is required to be disposed between a light absorbing layer and the hole selective film to improve passivation properties. In other words, in order to put carrier selective solar cells into practical use, it is necessary to obtain a hole selective film that has both hole selectivity and passivation properties, but the technology capable of obtaining a hole selective film that has both hole selectivity and passivation properties has not been established at the present stage. For bringing carrier selective solar cells into practical use, obtainment of a hole selective film that has both hole selectivity and passivation properties is what is needed for the improvement.

The present embodiment 1 achieves a particular configuration for obtaining a hole selective film that has both suitable hole selectivity and suitable passivation properties. In the following, the technical idea of the present embodiment 1 using such a particular configuration will be described.

Summary of Technical Idea in Embodiment 1

The technical idea in the present embodiment 1 to achieve the obtainment of a titanium oxide film that has both suitable hole selectivity and suitable passivation properties by using a titanium oxide film ($TiO_x$ film), which has been considered to function as an electron selective film in a carrier selective solar cell, as a hole selective film, and by configuring a particular producing process for the titanium oxide film.

In the following, the ability of a titanium oxide film to function as a hole selective film in a carrier selective solar cell with crystalline silicon is demonstrated.

The following description also explains that the technical idea in the present embodiment 1 is capable of obtaining passivation properties and high power generation performance superior to those of hole selective films composed of, for example, molybdenum oxide, tungsten oxide and vanadium oxide films, which have been commonly reported.

Furthermore, most of the previous studies on hole selective films obtained by using oxide semiconductor films have been about hole selective films formed on flat silicon (100) surfaces. The present embodiment mentions in this regard that high power generation performance can be obtained also for a titanium oxide film formed directly on a silicon (111) faceted surface with a more practical random pyramid texture structure formed thereon.

Device Structure of Carrier Selective Solar Cell

FIG. 1 illustrates a schematic device structure of a carrier selective solar cell. A grid-shaped metal electrode part on a light incident surface is omitted in FIG. 1. The grid-shaped metal electrode part is also omitted in FIGS. 2 and 14 to 16 described below.

In FIG. 1, carrier selective solar cell 100 includes crystalline silicon layer 10. Crystalline silicon layer 10 is composed of, for example, an n-type silicon layer with an n-type impurity such as phosphorus (P) introduced therein. The front surface (first main surface) of crystalline silicon layer 10 is a flat surface composed of a silicon (100) surface. Similarly, the back surface (second main surface) of crystalline silicon layer 10 is a flat surface composed of a silicon (100) surface.

Hole selective film 11 is formed on the front surface of crystalline silicon layer 10 so as to be in direct contact with crystalline silicon layer 10 as illustrated in FIG. 1. Electron selective film 12 is formed on the back surface of crystalline silicon layer 10 so as to be in direct contact with crystalline silicon layer 10 as illustrated in FIG. 1. In other words, crystalline silicon layer 10 is located between hole selective film 11 and electron selective film 12. Hole selective film 11 is composed of a titanium oxide film. Electron selective film 12 is meanwhile composed of, for example, a titanium oxide film or an amorphous silicon film containing hydrogen, but is not limited in the present embodiment 1.

Light transmissive electrode 13 is disposed on hole selective film 11 as illustrated in FIG. 1. Light transmissive electrode 13 is composed of a light transmissive film that allows at least visible light contained in sunlight to pass therethrough (light transmissive for the light) and has electrical conductivity. Metal electrode 14 is disposed so as to be in contact with electron selective film 12. Metal electrode 14 is formed of, for example, a silver film.

In carrier selective solar cell 100 configured as described above, for example, light is incident on carrier selective solar cell 100 from above light transmissive electrode 13. This light passes through light transmissive electrode 13 and titanium oxide film that constitutes light transmissive hole selective film 11, and is incident on crystalline silicon layer 10. Of the light incident on crystalline silicon layer 10, light having a light energy larger than the band gap of silicon excites electrons from the valence band to the conduction band in crystalline silicon layer 10. As a result, electron-hole pairs are generated inside crystalline silicon layer 10. Of the electrons and holes in the produced pairs, the holes ($h^+$) pass through titanium oxide film, namely hole selective film 11, and reach light transmissive electrode 13. Of the electrons and holes in the produced pairs, the electrons (e) pass through electron selective film 12 and reach metal electrode 14. As a result, a potential difference is generated between light transmissive electrode 13 and metal electrode 14. In other words, when carrier selective solar cell 100 is irradiated with light, an electromotive force is generated between light transmissive electrode 13 and metal electrode 14. When a load is connected between light transmissive electrode 13 and metal electrode 14, the load thus can be driven by the electromotive force generated between light transmissive electrode 13 and metal electrode 14. Carrier selective solar cell 100 thus operates as described above.

In carrier selective solar cell 100 illustrated in FIG. 1, for example, the surface of crystalline silicon layer 10 is a flat surface. This configuration increases the reflection loss of light on the flat surface, thereby reducing the short-circuit current density of carrier selective solar cell 100. As a result, the performance of carrier selective solar cell 100 decreases. In order to improve the performance of carrier selective solar cell 100 for bringing carrier selective solar cell 100 into practical use, for example, a random pyramid texture structure is formed on the surface of the crystalline silicon layer 10.

Figure 2:
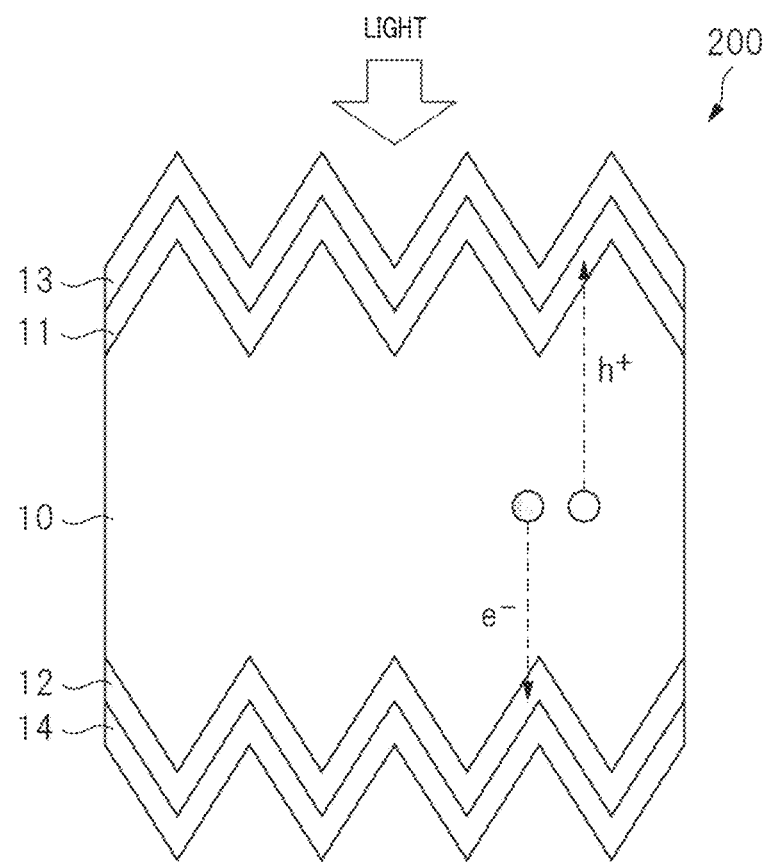
FIG. 2 illustrates a schematic device structure of a carrier selective solar cell in which structures with random pyramid-shaped texture (hereinafter referred to as "random pyramid texture structure") are respectively formed on the front surface and the back surface of a crystalline silicon layer.

Specifically, FIG. 2 illustrates a schematic device structure of carrier selective solar cell 200 in which random pyramid texture structures are respectively formed on the front surface and the back surface of crystalline silicon layer 10. Both the front and back surfaces of crystalline silicon layer 10 are composed of silicon (111) faceted surfaces to form the random pyramid texture structures in FIG. 2. As a result, carrier selective solar cell 200 illustrated in FIG. 2 can have an improved conversion efficiency by the effects of reflection reduction and light confinement by virtue of the random pyramid texture structures. That is, carrier selective solar cell 200 having a random pyramid texture structure formed therein as illustrated in FIG. 2 can be used as a solar cell having excellent performance that can be put into practical use. In carrier selective solar cell 200 configured in this way, the holes ($h^+$) of the electron-hole pairs generated in crystalline silicon layer 10 by light incidence pass through the titanium oxide film that constitutes hole selective film 11 to reach light transmissive electrode 13. The electrons (e) of the electron-hole pairs pass through electron selective film 12 and reach metal electrode 14. When a load is connected between light transmissive electrode 13 and metal electrode 14, the load thus can be driven by the electromotive force generated between light transmissive electrode 13 and metal electrode 14 also in carrier selective solar cell 200 illustrated in FIG. 2.

Features of Device Structure

In the following, the features of the device structure of the carrier selective solar cell in the present embodiment 1 will be described. The features in the present embodiment 1 come from the fact that, for example, hole selective film 11 illustrated in FIGS. 1 and 2 is composed of a titanium oxide film. This configuration allows the present embodiment 1 to obtain hole selective film 11 that has both hole selectivity and passivation properties.

The term "hole selectivity" refers to the performance that selectively allows holes to pass through while selectively blocking electrons. For example, suitable "hole selectivity" means excellent performance in selectively allowing holes to pass through while selectively blocking electrons.

In addition, the term "passivation properties" means a function of suppressing the recombination of electrons and holes caused by dangling bonds residing on the surface of the base layer (for example, crystalline silicon layer 10 in FIGS. 1 and 2) with which the carrier selective film comes into contact. In particular, the "passivation properties" focused on hole selective film 11 means a function of suppressing the recombination of electrons and holes caused by dangling bonds residing on the surface of the base layer with which hole selective film 11 comes into contact. For example, hole selective film 11 with suitable "passivation properties" has a function that is excellent for suppressing the recombination of electrons and holes caused by dangling bonds residing on the surface of the base layer by chemically terminating the dangling bonds. In addition, hole selective film 11 with suitable "passivation properties" has a function that is excellent for suppressing the recombination of electrons and holes caused by dangling bonds residing on the surface of the base layer, by generating an electric field effect that moves electrons away from the dangling bonds by the fixed charge residing inside hole selective film 11. The features of the present embodiment are particularly found in the fact that a hole selective film composed of a titanium oxide film can achieve the same or better passivation properties as those of commonly used electron selective films. The expression that a hole selective film composed of a titanium oxide film has suitable passivation properties is used herein in the sense that a hole selective film composed of a titanium oxide film can achieve the same or better passivation properties as those of commonly used electron selective films.

The present embodiment 1 employs a titanium oxide film as hole selective film 11 having suitable hole selectivity and suitable passivation properties. This is the unique feature of the present embodiment 1. However, it should be noted that not all the titanium oxide films can serve the purpose. In other words, the features of the present embodiment 1 are found in the fact that hole selective film 11 is composed of titanium oxide, but only employing a particular method for producing the titanium oxide can obtain a titanium oxide film that has both suitable hole selectivity and suitable passivation properties. Hereinafter, the detail will be described.

For example, the titanium oxide film can be formed by using a plasma atomic layer deposition method or a thermal atomic layer deposition method. Titanium oxide films formed by the plasma atomic layer deposition method using oxygen plasma tend to have electron selectivity. On the other hand, titanium oxide films formed by the thermal atomic layer deposition method using water vapor tend to have hole selectivity. In other words, a titanium oxide film can be electron selective or hole selective, depending on the producing method used to form the titanium oxide film. In the present embodiment 1, a titanium oxide film formed by the thermal atomic layer deposition method is employed as hole selective film 11. This is because the titanium oxide film formed by the thermal atomic layer deposition method is more likely to have hole selectivity. However, the present inventors' study has newly revealed that not all the titanium oxide films formed by the thermal atomic layer deposition method have both suitable hole selectivity and suitable passivation properties. Based on the premise that titanium oxide films are formed by the thermal atomic layer deposition method, the present inventors have newly found that titanium oxide films having both suitable hole selectivity and suitable passivation properties can be obtained only by further employing a particular producing process.

In the following, how particular the method for producing a titanium oxide film having both suitable hole selectivity and suitable passivation properties is will be described.

Method for Producing Carrier Selective Solar Cell

Figure 3:
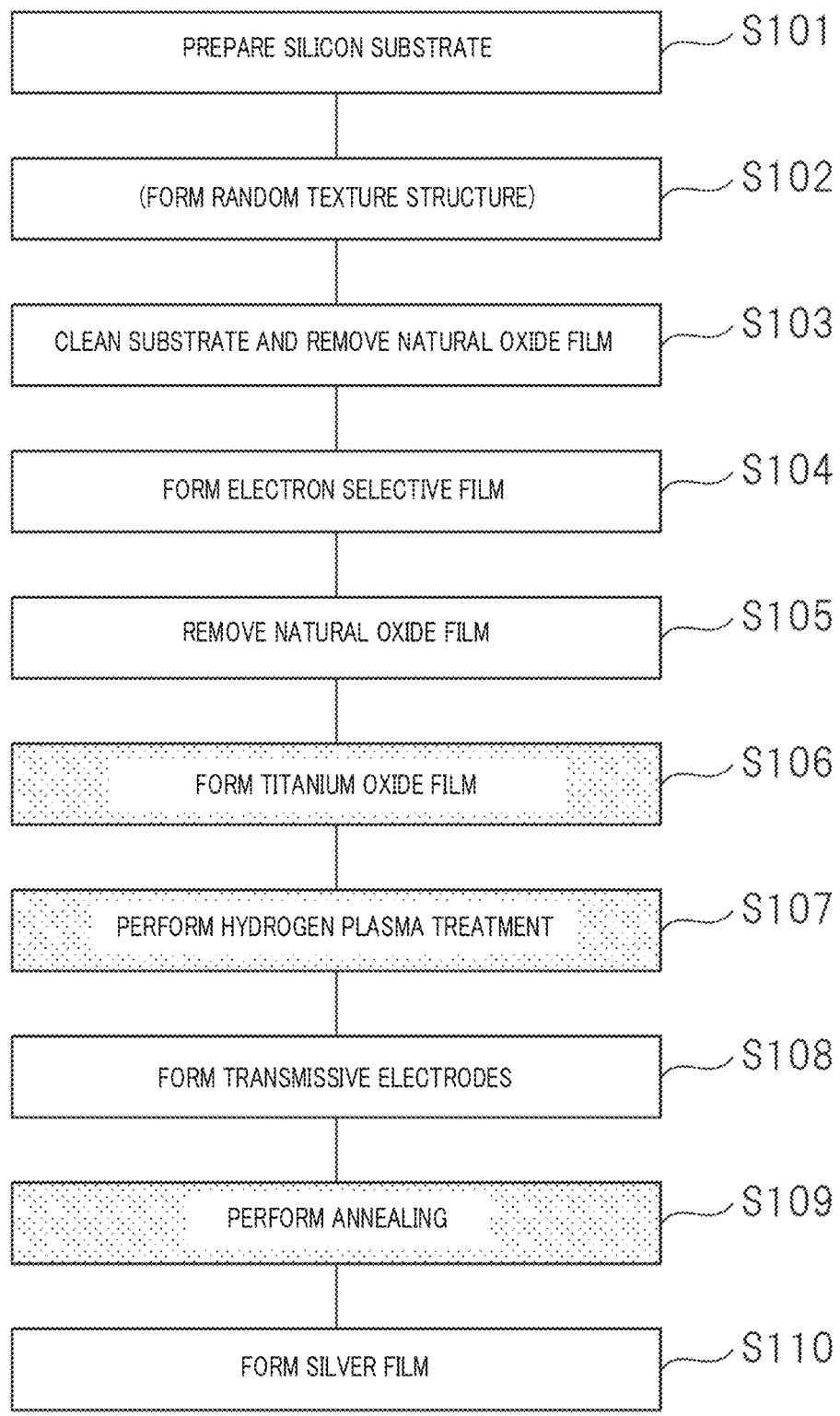
FIG. 3 is a flow chart explaining a producing process of the carrier selective solar cell in Embodiment 1.

FIG. 3 is a flow chart explaining a producing process of a carrier selective solar cell in the present embodiment 1. An n-type silicon substrate is prepared (S101). The silicon substrate has, for example, a (100) surface as a front surface, and has a specific resistivity of 2 Ωcm and a thickness of 280 μm. A random texture structure is then formed on the silicon substrate by applying anisotropic etching on the (100) surface of the silicon substrate (S102). For example, a (111) faceted surface is formed on the front surface of the silicon substrate by wet etching using a solution containing potassium hydroxide (KOH) as a main component. As a result, a random texture structure composed of the (111) faceted surface is formed on the front surface of the silicon substrate.

Although this part of the description explains the example with the random texture structure formed therein for increasing the effects of reflection reduction and light confinement, there may be cases where a random texture structure is not formed on the front surface of a silicon substrate in the process of producing a carrier selective solar cell for evaluation. However, also in the process of producing the carrier selective solar cell for evaluation, forming a random texture structure on the front surface of the silicon substrate can obtain evaluation results corresponding to those of an actual solar cell.

After cleaning the silicon substrate, the natural oxide films formed on the front surface and the back surface of the silicon substrate are then removed by, for example, using dilute hydrofluoric acid (S103). An electron selective film having suitable passivation properties is formed on the back surface (on the side opposite to the light incident surface) of the silicon substrate (S104). The electron selective film having suitable passivation properties may be composed of, for example, a film stack (a-Si: H i-n) of an intrinsic hydrogenated amorphous silicon film and an n-type hydrogenated amorphous silicon film. The intrinsic hydrogenated amorphous silicon film and the n-type hydrogenated amorphous silicon film can be formed, for example, by using a plasma chemical vapor deposition (CVD) method. The intrinsic hydrogenated amorphous silicon film functions as a passivation film, while the n-type hydrogenated amorphous silicon film functions as an electron selective film. As a result, the film stack of the intrinsic hydrogenated amorphous silicon film and the n-type hydrogenated amorphous silicon film becomes an electron selective film having suitable passivation properties.

In the present embodiment 1, an amorphous silicon film commonly used in a heterojunction solar cell is used as an electron selective film having suitable passivation properties. Alternatively, an electron selective film having suitable passivation properties in the present embodiment may also be composed of, for example, any film other than the film stack of the intrinsic hydrogenated amorphous silicon film and the n-type hydrogenated amorphous silicon film. For example, a titanium oxide film produced by the plasma atomic layer deposition method may also be used as the electron selective film having suitable passivation properties in the present embodiment 1. In this case, a special high-pressure gas typically represented by silane ($SiH_4$) is not required, thus capital investment and maintenance costs can be limited.

The natural oxide film is then removed by using dilute hydrofluoric acid on the silicon substrate again (S105). A titanium oxide film is then formed on the front surface of the silicon substrate, i.e., on the light incident surface (S106). The titanium oxide film is formed by the thermal atomic layer deposition method. FLexAL from Oxford Instruments is used for the atomic layer deposition system in the present embodiment 1. In the system, titanium isopropoxide (TTIP) is used as the titanium precursor, and water vapor ($H_2O$) is used as the oxygen source. In one cycle, the dosing time of TTIP is set to 1.2 seconds, and water is dosed for 1.2 seconds, which is repeated five times. The deposition temperature of titanium oxide is in the range of 120 to 350° C. Repeating this ALD cycle 128 times forms a titanium oxide film having a thickness of about 5 nm on the front surface of the silicon substrate. As a comparison, a solar cell is produced in which titanium oxide—formed by the plasma atomic layer deposition method—is formed on the front surface of the silicon substrate, i.e., on the light incident surface. For the comparative solar cell, the same TTIP as in the thermal atomic layer deposition method is used as the titanium precursor, but oxygen plasma is used as the oxygen source. In one cycle, the dosing time of TTIP is set to 1.2 seconds, and dosing time of the oxygen plasma is set to 6 seconds. Repeating this ALD cycle 100 times forms a titanium oxide film having a thickness of about 5 nm on the front surface of the silicon substrate.

After forming the titanium oxide film on the front surface of the silicon substrate, hydrogen plasma treatment for irradiating the front surface of the titanium oxide film with hydrogen plasma is then performed within the range of 60 minutes (S107). The hydrogen plasma is generated under the conditions of a hydrogen flow rate of 50 sccm, a pressure of 10 Pa, and a discharge power of 600 W by using an inductively coupled plasma source attached to the atomic layer deposition system. Light transmissive electrodes are then respectively formed on the back surface of the electron selective film and the surface of the titanium oxide film, for example, by a sputtering method (S108). The light transmissive electrode is light transmissive for at least visible light and is composed of, for example, indium-tin oxide (ITO) having a thickness of 70 nm to 150 nm. Then, annealing is performed in an oven at 180° C. for 2 hours (S109). Annealing is performed in a low vacuum or in an atmosphere containing oxygen, such as air.

As the last step, a silver film, which is to serve as a metal electrode, is formed on both surfaces, i.e., the back surface of the light transmissive electrode formed on the back surface of the electron selective film and the front surface of the light transmissive electrode formed on the front surface of the titanium oxide film (S110). The silver film formed on the light incidence side is processed into a grid shape for acquiring sufficient regions where light passes through. For example, the area of the silver film in the cell area is about 4%.

The carrier selective solar cell of the present embodiment 1 is produced as described above. In the carrier selective solar cell produced in this way, the titanium oxide film formed directly on the surface of the silicon substrate (crystalline silicon layer) becomes a hole selective film that has suitable hole selectivity and suitable passivation properties. In other words, the present embodiment has features in the producing method as follows: (1) a titanium oxide film is formed directly on the surface of crystalline silicon by a thermal atomic layer deposition method, (2) hydrogen plasma treatment is performed on the titanium oxide film, and (3) after forming a light transmissive electrode on the titanium oxide film, annealing is performed in an atmosphere containing oxygen. As a result, the titanium oxide film formed directly on the crystalline silicon becomes a hole selective film that has suitable hole selectivity and suitable passivation properties. In the following, the results of the examination on the above features will be described.

Examination Results

Figure 4:
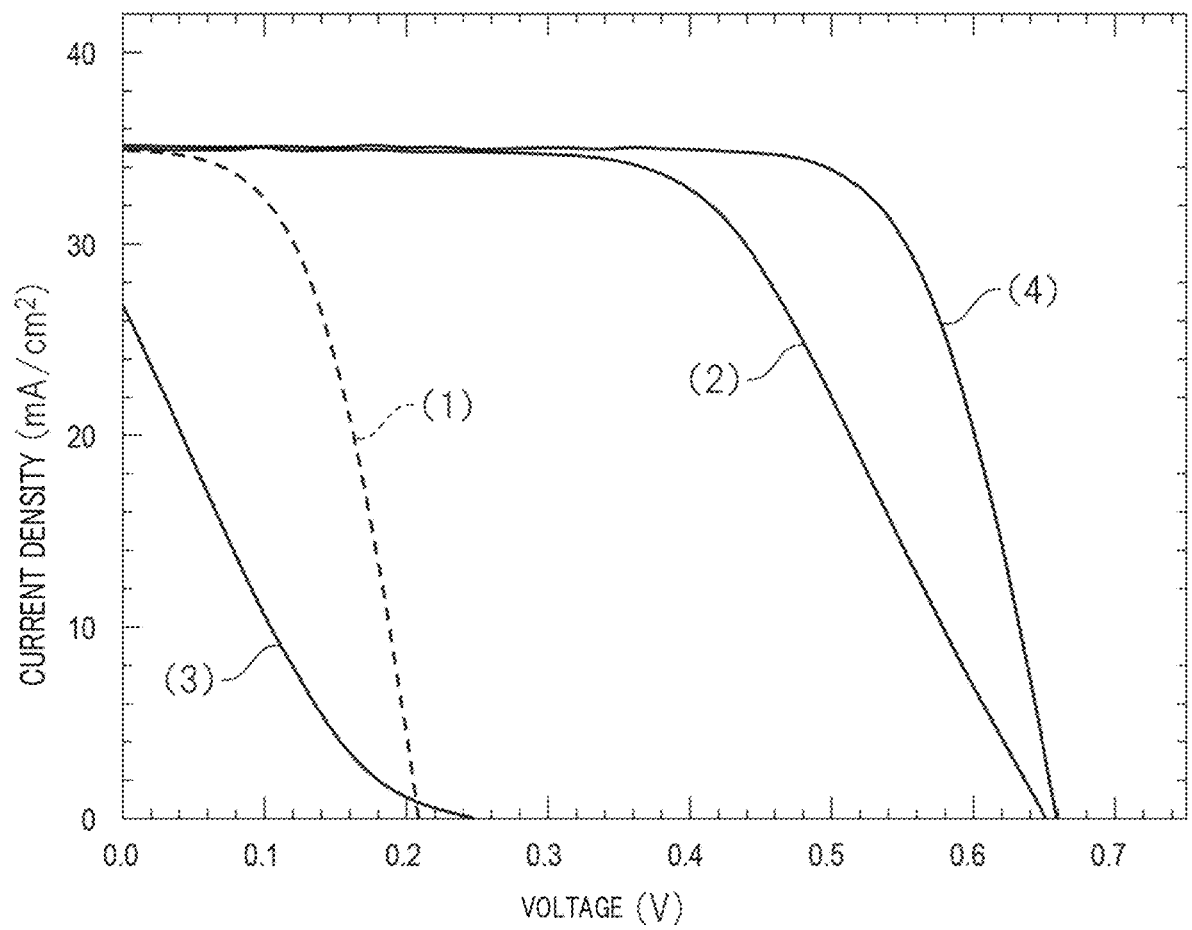
FIG. 4 is a graph showing the current-voltage characteristics of a carrier selective solar cell with a crystalline silicon layer having a flat (100) surface.

FIG. 4 is a graph showing the current-voltage characteristics of, for example, a carrier selective solar cell with a crystalline silicon layer having a flat (100) surface.

In FIG. 4, graph (1) shows the current-voltage characteristics of a carrier selective solar cell having a structure in which a light transmissive electrode is formed on a flat (100) surface of a crystalline silicon layer without forming a titanium oxide film. The solar cell represented by graph (1) of FIG. 4 has a remarkably low open circuit voltage (0.2 V), indicating that the performance thereof as a carrier selective solar cell is poor.

On the other hand, graph (2) in FIG. 4 shows the current-voltage characteristics of a carrier selective solar cell having a structure in which a titanium oxide film is formed on the flat (100) surface of a crystalline silicon layer by the thermal atomic layer deposition method at a deposition temperature of 200° C., and a light transmissive electrode is formed on the titanium oxide film. Comparing graph (2) in FIG. 4 with graph (1) in FIG. 4 shows that the solar cell represented by graph (2) in FIG. 4 has a dramatically improved open circuit voltage (0.66 V) and a significantly improved fill factor (FF).

Meanwhile, graph (3) in FIG. 4 shows the current-voltage characteristics of a carrier selective solar cell having a structure in which a titanium oxide film is formed on the flat (100) surface of a crystalline silicon layer by the plasma atomic layer deposition method at a deposition temperature of 200° C., and a light transmissive electrode is formed on the titanium oxide film. The graphs show that the performance of the carrier selective solar cell represented by graph (3) of FIG. 4 is even worse than that of the carrier selective solar cell, having no titanium oxide film, represented by in graph (1) of FIG. 4.

The above results show that the titanium oxide film formed by the plasma atomic layer deposition method does not function as a hole selective film but as an electron selective film, while the titanium oxide film formed by the thermal atomic layer deposition method functions as a hole selective film.

For the carrier selective solar cell represented by graph (2) of FIG. 4, the fill factor (FF) is relatively improved but not sufficient for the performance of the solar cell. In this regard, graph (4) in FIG. 4 shows the current-voltage characteristics of a carrier selective solar cell having a structure in which a titanium oxide film is formed on the flat (100) surface of a crystalline silicon layer by the thermal atomic layer deposition method at a deposition temperature of 200° C., hydrogen plasma treatment is performed on the titanium oxide film at a temperature the same as the deposition temperature, and then a light transmissive electrode is formed on the titanium oxide film. The graphs show that the fill factor (FF) of the carrier selective solar cell represented by graph (4) of FIG. 4 is greatly improved by performing the hydrogen plasma treatment on the titanium oxide film as compared to the carrier selective solar cell represented by graph (2) of FIG. 4.

From the foregoing, the combination of forming a titanium oxide film directly on the surface of crystalline silicon by the thermal atomic layer deposition method, and performing the hydrogen plasma treatment on the titanium oxide film can greatly improve the performance of a carrier selective solar cell with a titanium oxide film used as a hole selective film.

Figure 5:
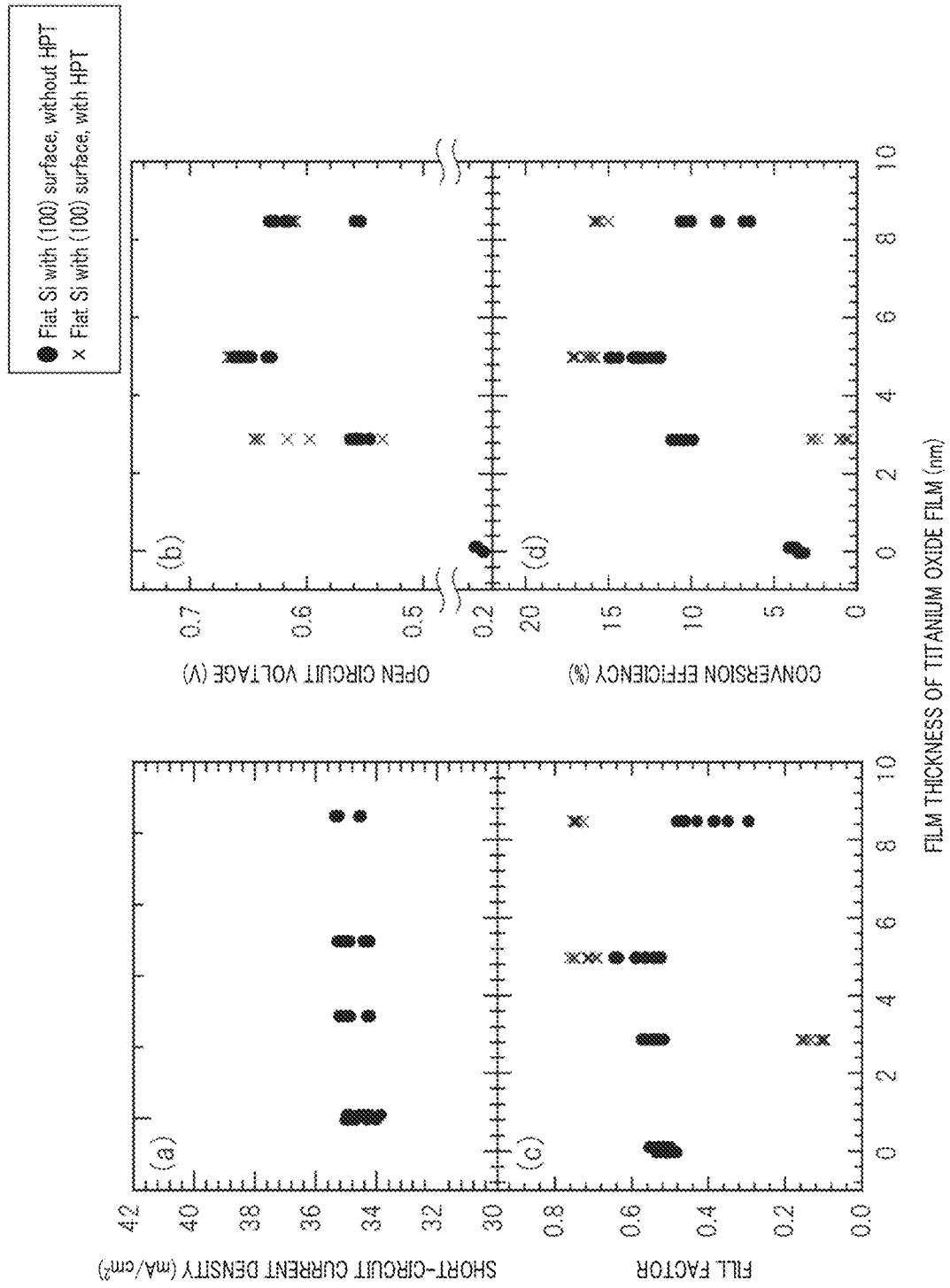
FIG. 5 is a diagram showing the film thickness dependence of a sample for the carrier selective solar cell with the crystalline silicon layer having a flat (100) surface, and in the sample, a titanium oxide film is formed by a thermal atomic layer deposition method (particularly, FIG. 5 illustrates graphs that show the relationships of the thickness of the titanium oxide film to (a) short-circuit current density, (b) open-circuit voltage, (c) fill factor, and (d) conversion efficiency)

FIG. 5 is a diagram showing the film thickness dependence of, for example, a carrier selective solar cell with a crystalline silicon layer having a flat (100) surface. The titanium oxide film is formed by the thermal atomic layer deposition method at a deposition temperature of 200° C. In particular, FIG. 5 illustrates graphs that show the relationships of the film thickness of the titanium oxide film to (a) short-circuit current density, (b) open circuit voltage, (c) fill factor, and (d) conversion efficiency.

The term "(film) thickness of titanium oxide film" herein is used to include the interlayer film (interface layer) formed at the interface between the titanium oxide film and the crystalline silicon layer. In other words, the titanium oxide film and the interlayer film in combination herein are particularly referred to as the titanium oxide film in many cases, but when it is necessary to distinguish between the titanium oxide film and the interlayer film, the titanium oxide film and the interlayer film may be explicitly indicated as separate films.

In FIG. 5, a "black circle mark" represents a sample that is not subjected to hydrogen plasma treatment (HPT), while a "×" mark represents a sample that is subjected to hydrogen plasma treatment (HPT) at 200° C., which is the same temperature as the deposition temperature, for 15 minutes.

Graph (a) of FIG. 5 shows that the value of the short-circuit current density is substantially constant even when the film thickness of the titanium oxide film is changed. Graph (a) of FIG. 5 also shows that the short-circuit current density does not change even when the hydrogen plasma treatment is performed (the × marks are not explicitly shown because they are superimposed behind the black circle marks). Graph (b) of FIG. 5 shows that the open circuit voltage is dramatically improved by forming titanium oxide film as compared to the case without forming a titanium oxide film (0 nm). In particular, the open circuit voltage reaches the maximum value when the film thickness of the titanium oxide film is 5 nm.

Graph (c) of FIG. 5 shows that when the film thickness of the titanium oxide film becomes smaller than 3 nm, the fill factor becomes worse when the hydrogen plasma treatment is performed than when the hydrogen plasma treatment is not performed. Meanwhile, graph (c) of FIG. 5 shows that when the film thickness of the titanium oxide film becomes larger than 3 nm, the fill factor is improved by performing the hydrogen plasma treatment.

Graph (d) of FIG. 5 shows that when the film thickness of the titanium oxide film becomes larger than 3 nm, the conversion efficiency becomes higher when the hydrogen plasma treatment is performed than when the hydrogen plasma treatment is not performed.

From the foregoing, for example, when the film thickness of the titanium oxide film is larger than 3 nm, performing the hydrogen plasma treatment on the titanium oxide film can improve the performance of the carrier selective solar cell—the performance represented by the open circuit voltage, fill factor, and conversion efficiency—as compared to the case of hydrogen plasma treatment not being performed. In addition, when the film thickness of the titanium oxide film is, for example, smaller than 8 nm, higher performance can be obtained.

In the following, described are the examination results from, for example, a carrier selective solar cell with a crystalline silicon layer having a flat (100) surface and also a carrier selective solar cell with a crystalline silicon layer having a (111) faceted surface.

Figure 6:
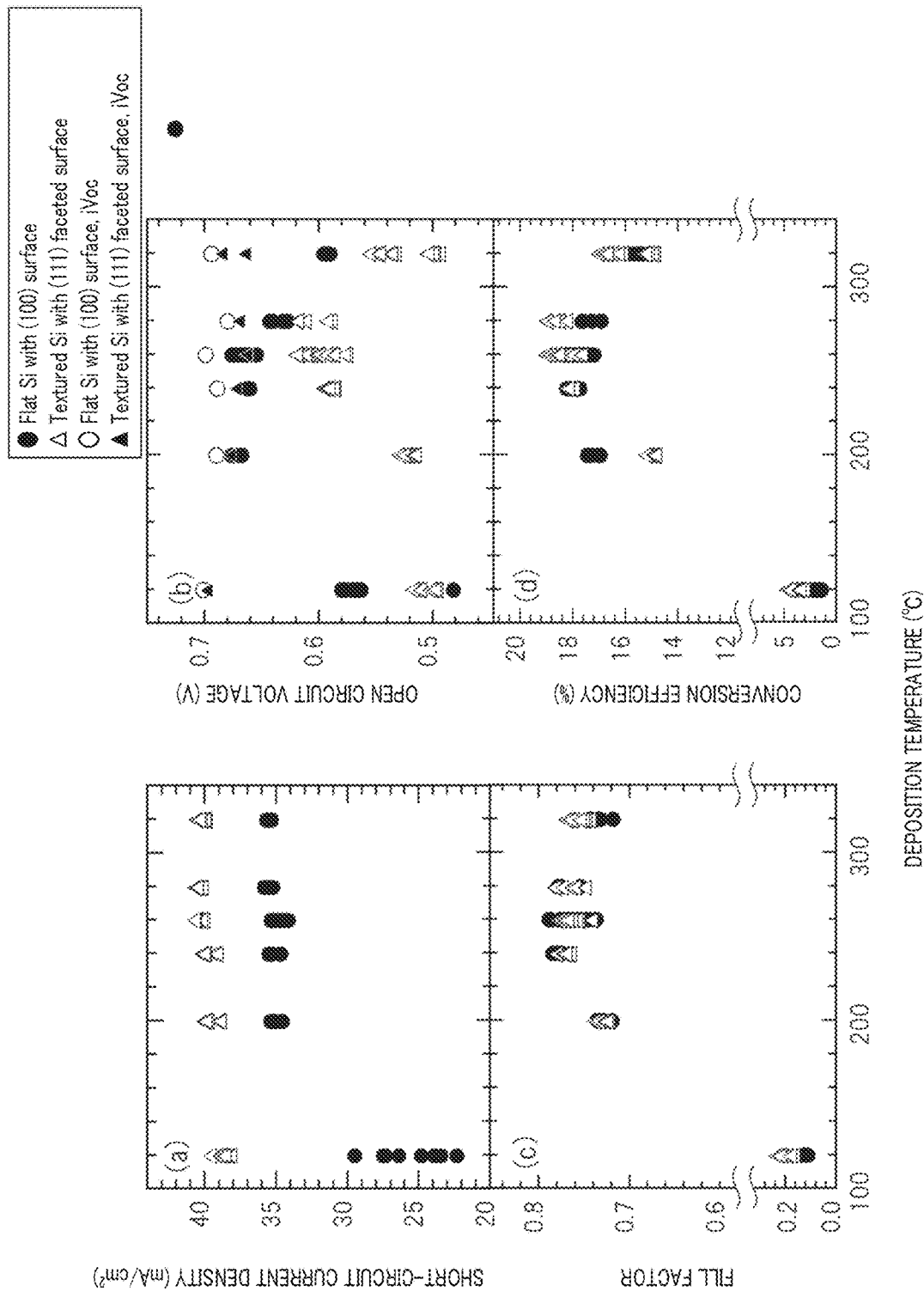
FIG. 6 is a diagram showing the deposition temperature dependence in the properties of a carrier selective solar cell (particularly, FIG. 6 illustrates graphs that show the relationships of the deposition temperature of the titanium oxide film in the thermal atomic layer deposition method to (a) short-circuit current density, (b) open circuit voltage, (c) fill factor, and (d) conversion efficiency)

FIG. 6 is a diagram showing the deposition temperature dependence of the solar cell properties in a carrier selective solar cell. FIG. 6 shows the results with hydrogen plasma treatment performed for 15 minutes at the same temperature as the deposition temperature for all the samples. In particular, FIG. 6 illustrates graphs that show the relationships of the deposition temperature of the titanium oxide film in the thermal atomic layer deposition method to (a) short-circuit current density, (b) open circuit voltage, (c) fill factor, and (d) conversion efficiency.

In FIG. 6, a "black circle mark" represents a sample having a (100) surface, while a "white triangle mark" represents a sample having a (111) faceted surface.

In addition, a "white circle mark" represents an open circuit voltage (implied Voc) obtained from the lifetime evaluation of carriers in the crystalline silicon layer having a (100) surface, and reflects the passivation properties. In particular, the "white circle mark" corresponds to the open circuit voltage when the carrier selectivity is ideal.

Similarly, the "black triangle mark" represents an open circuit voltage (implied Voc) obtained from the lifetime evaluation of carriers in the crystalline silicon layer having a (111) faceted surface, and reflects the passivation properties. In particular, the "black triangle mark" corresponds to the open circuit voltage when the carrier selectivity is ideal.

Graphs (a) to (d) of FIG. 6 show that samples with (100) surfaces achieve high performance of a carrier selective solar cell when the deposition temperature of the titanium oxide film is in the range of 200° C. to 260° C. On the other hand, when the deposition temperature of the titanium oxide film is lower than 120° C., the open circuit voltage and fill factor are significantly lowered as a result of the loss in selectivity of carriers (hole selectivity) and transportability of carriers (carrier transportability), although the passivation properties are high. For samples with (111) faceted surfaces, the optimum deposition temperature for improving the performance of carrier selective solar cells is 260° C. to 280° C. That is, the graphs show that the optimum temperature range of the samples with (111) faceted surfaces shifts to the higher temperature side and becomes narrower than that of the samples with (100) surfaces. In other words, the optimum deposition temperature varies greatly depending on the surface flatness and surface orientation of a crystalline silicon layer.

In the following, described are the examination results from, for example, a carrier selective solar cell with a crystalline silicon layer having a flat (100) surface, a carrier selective solar cell with a crystalline silicon layer having a (111) faceted surface, and a carrier selective solar cell with a crystalline silicon layer having a flat (111) surface.

Figure 7:
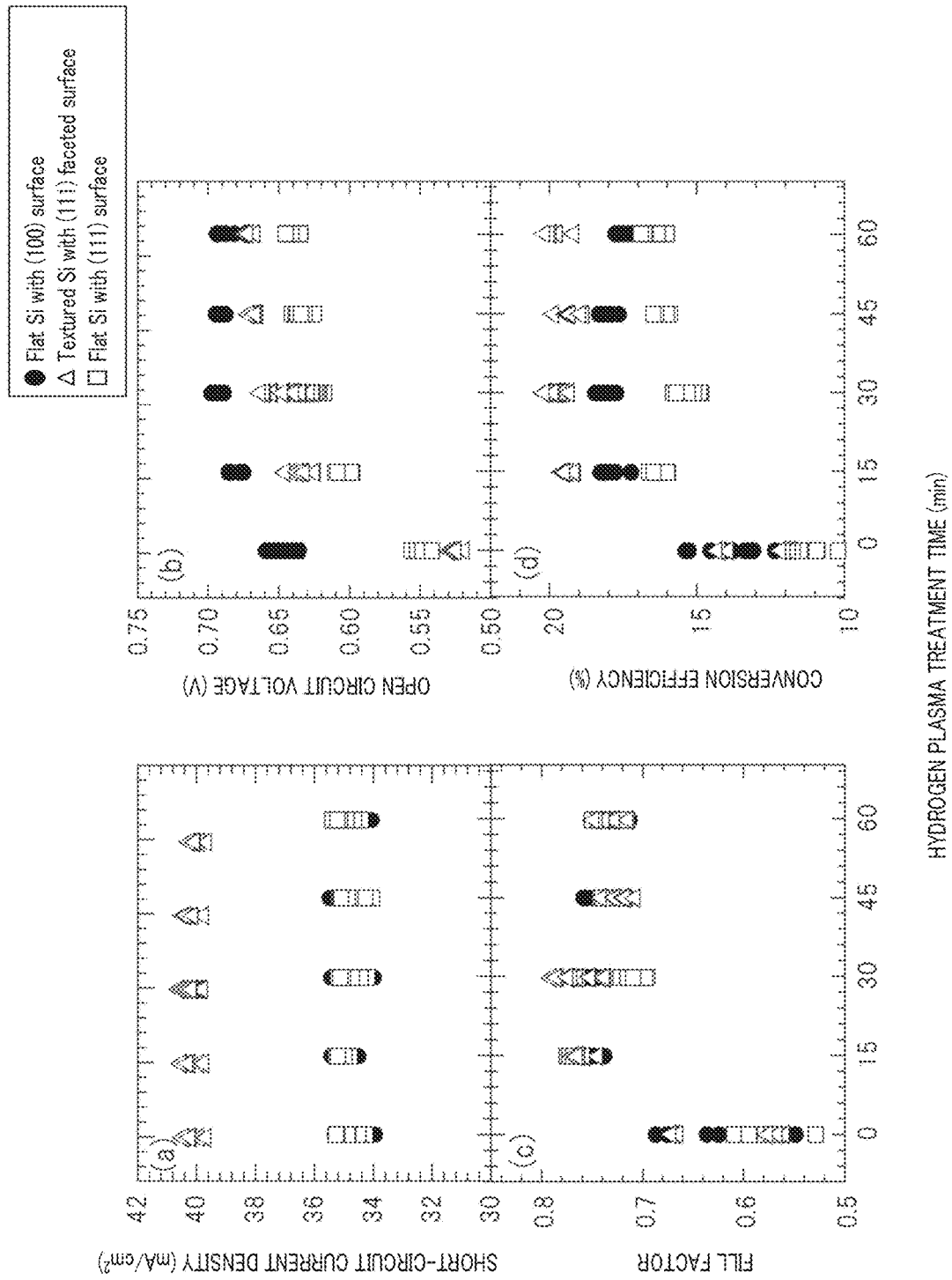
FIG. 7 is a diagram showing the relationship between the properties of the carrier selective solar cell and the hydrogen plasma treatment time (particularly, FIG. 7 illustrates graphs that show the relationships of the hydrogen plasma treatment time to (a) short-circuit current density, (b) open circuit voltage, (c) fill factor, and (d) conversion efficiency)

FIG. 7 is a diagram showing the relationship between the hydrogen plasma treatment time and the properties of the carrier selective solar cell in which a titanium oxide film is formed by the thermal atomic layer deposition method at a deposition temperature of 280° C. The hydrogen plasma treatment is performed at 280° C., which is the same as the deposition temperature of the titanium oxide film. In particular, FIG. 7 illustrates graphs that show the relationships of the hydrogen plasma treatment time to (a) short-circuit current density, (b) open circuit voltage, (c) fill factor, and (d) conversion efficiency.

In FIG. 7, a "black circle mark" represents a sample with a (100) surface, while a "white triangle mark" represents a sample with a (111) faceted surface. A "white square mark" represents a sample with a flat (111) surface.

Graphs (b) and (c) of FIG. 7 show that performing hydrogen plasma treatment improves the open circuit voltage and fill factor for all samples. In particular, for the samples with (111) faceted surfaces and the samples with flat (111) surfaces, the open circuit voltage tends to improve dramatically by hydrogen plasma treatment. In other words, the difference in the open circuit voltage between solar cells having (111) faceted surfaces and solar cells having flat (100) surfaces obviously comes from the difference in the surface orientation of the crystalline silicon layer. Too long hydrogen plasma treatment time (30 min or more) meanwhile causes slight reduction of the fill factor for all samples. From the above, the hydrogen plasma treatment time at which the maximum conversion efficiency can be obtained is approximately 30 min, although the time depends on the surface orientation and shape of the crystalline silicon.

The features in the producing method of the present embodiment are as follows: (1) a titanium oxide film is formed directly on the surface of crystalline silicon by a thermal atomic layer deposition method, (2) hydrogen plasma treatment is performed on the titanium oxide film, and (3) after forming a light transmissive electrode on the titanium oxide film, annealing is performed in an atmosphere containing oxygen. The features in the producing method of the present embodiment allow for obtainment of a hole selective film that has suitable hole selectivity and suitable passivation properties from the titanium oxide film formed directly on the crystalline silicon.

In this regard, in the thermal atomic layer deposition method, unlike the plasma atomic layer deposition method using oxygen plasma, water vapor ($H_2O$) is used as an oxygen supply source for forming a titanium oxide film. It can be thus considered as follows: the hydrogen element from water vapor is mixed in the titanium oxide film, and hydrogen is also mixed into the titanium oxide film by performing the hydrogen plasma treatment; and thus the mixing of hydrogen into the titanium oxide film may result in the titanium oxide film having suitable hole selectivity and suitable passivation properties. In particular, for example, the dangling bonds residing at the interface between the crystalline silicon layer and the titanium oxide film are terminated by hydrogen mixed in the titanium oxide film, and as a result, carrier recombination due to the dangling bond is suppressed. This may be the reason for the improvement of the passivation properties of the titanium oxide film.

In addition, the present inventors' study has revealed that (1) when annealing is performed in an atmosphere containing oxygen after a light transmissive electrode is formed on or above the titanium oxide film, the passivation properties and the hole selectivity of the titanium oxide film are both improved. In this regard, (2) when the annealing is performed in an atmosphere containing oxygen before the light transmissive electrode is formed on or above the titanium oxide film, the passivation properties of the titanium oxide film is greatly improved, but the fill factor of the solar cell is significantly reduced. Meanwhile, (3) when the annealing is performed in an oxygen-free atmosphere before the light transmissive electrode is formed on or above the titanium oxide film, little improvement in passivation properties is observed. In addition, (4) even after the light transmissive electrode is formed on or above the titanium oxide film, annealing in an oxygen-free atmosphere brings improvement of passivation properties in the titanium oxide film higher than that in the case of (3), but the improvement is lower than in the case of (1). Therefore, for example, the subtle oxygen concentration at the interface between the crystalline silicon layer and the titanium oxide film may contribute to the improvement of the passivation properties and hole selectivity of the titanium oxide film.

In other words, the present inventors' study has revealed that the elemental composition at the interface between the crystalline silicon layer and the titanium oxide film is considered to play an important role in the titanium oxide film formed according to the features in the producing method of the present embodiment. Specifically, from the results of the study described above, at least the hydrogen element concentration and the oxygen element concentration at the interface between the crystalline silicon layer and the titanium oxide film are considered to significantly contribute to the improvement of the hole selectivity and the passivation properties of the titanium oxide film.

In order to examine the effect of the interface structure between a crystalline silicon layer and a titanium oxide film on the hole selectivity and passivation properties of a titanium oxide film, the inventors examine the interface structure between the crystalline silicon layer and the titanium oxide film in detail. In the following, the results of this examination will be described.

Examination Results of Interface Structure

Figure 8:
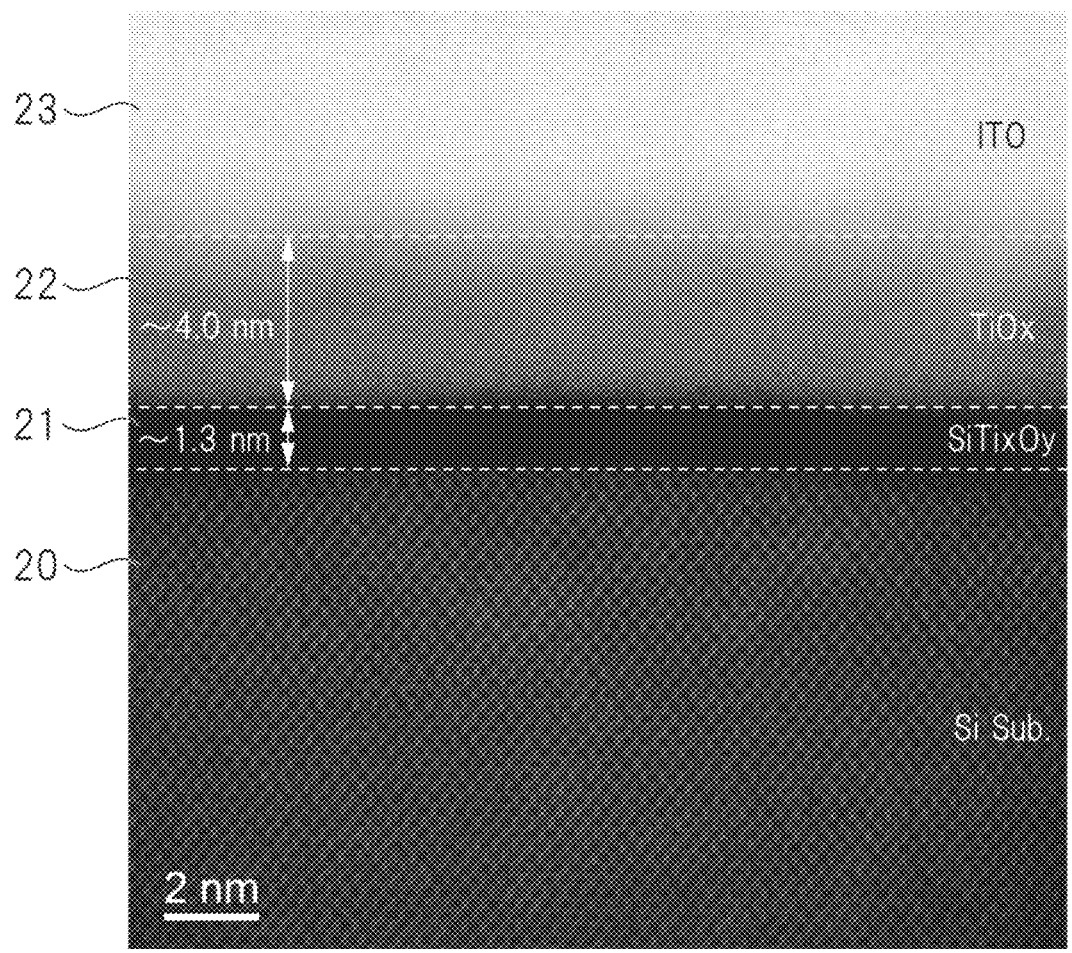
FIG. 8 is a photograph showing a part of the cross-sectional structure of the carrier selective solar cell produced by using the crystalline silicon layer having a flat (100) surface.

FIG. 8 is a photograph showing a part of the cross-sectional structure of a carrier selective solar cell produced by using a crystalline silicon layer having a flat (100) surface. FIG. 8 shows a cross section of a carrier selective solar cell observed with a high-resolution transmission electron microscope. As shown in FIG. 8, interlayer film 21 is formed on crystalline silicon layer 20, and titanium oxide film 22 is formed on interlayer film 21. Titanium oxide film 22 and interlayer film 21 are shown in FIG. 8 as separate films. Light transmissive electrode 23 is formed on titanium oxide film 22. FIG. 8 shows that the film thickness of the formed titanium oxide film 22 is about 4 nm, and interlayer film (interface layer) 21 having a film thickness of about 1 nm is formed at the interface between crystalline silicon layer 20 and titanium oxide film 22. Evaluation of the composition of interlayer film 21 by energy dispersive X-ray analysis has found that interlayer film 21 is a film containing silicon element (Si), titanium element (Ti), and oxygen element (O). As shown in the following, it was found that interlayer film 21 becomes a film containing hydrogen element (H) in addition to the above elements depending on the deposition conditions. In order to analyze the composition of interlayer film 21 formed at the interface between crystalline silicon layer 20 and titanium oxide film 22 in more detail, quantitative analysis of each element contained in interlayer film 21 is conducted by Rutherford backscattering spectroscopy (RBS) and elastic recoil detection analysis (ERDA).

Figure 9:
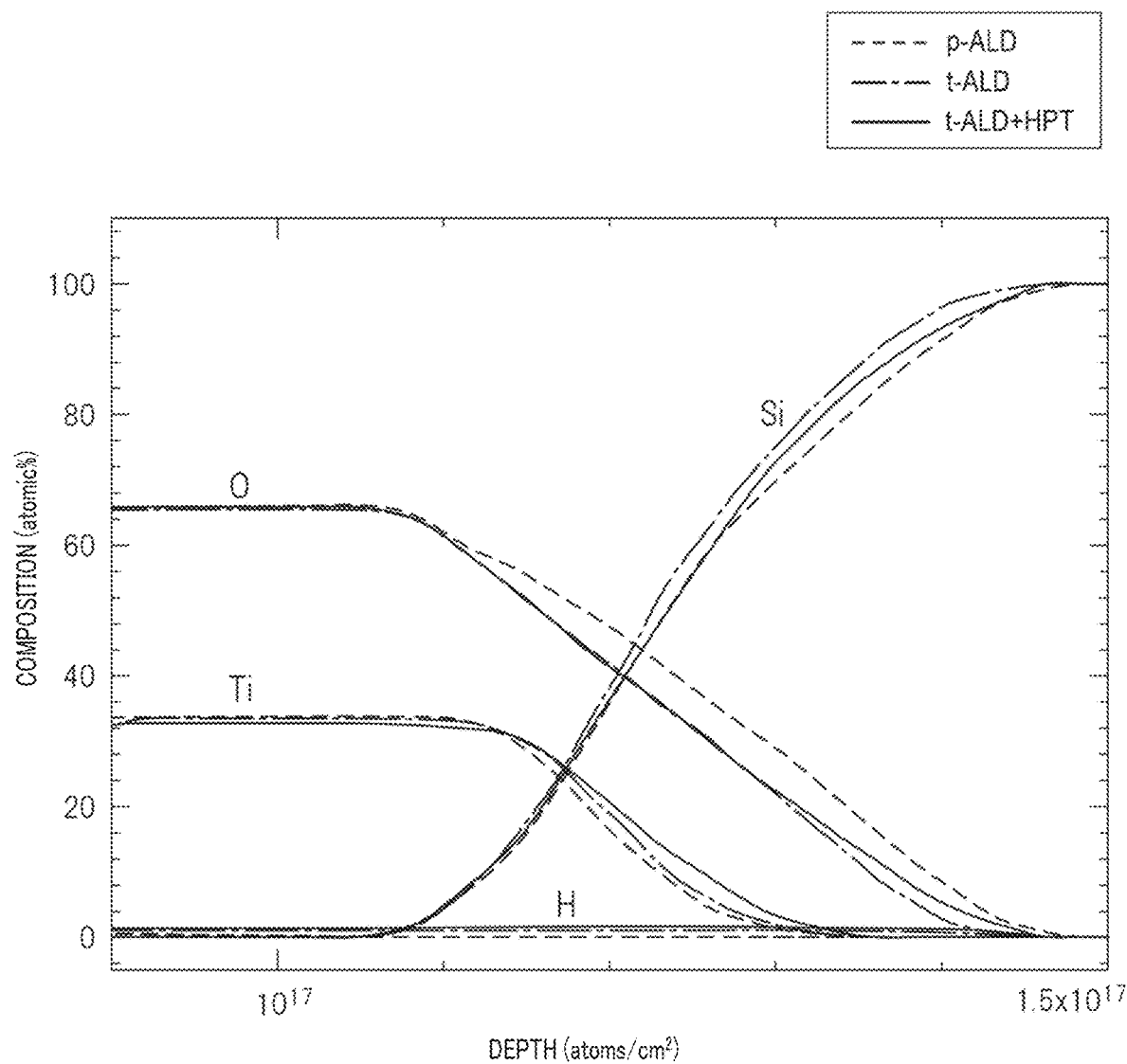
FIG. 9 is a graph showing the results of quantitative analysis of each element contained in an interlayer film by Rutherford backscattering spectroscopy (RBS) and elastic recoil detection analysis (ERDA) for a sample having a structure equivalent to that of the carrier selective solar cell produced by using the crystalline silicon layer having a flat (100) surface (vertical axis: linear representation)
Figure 10:
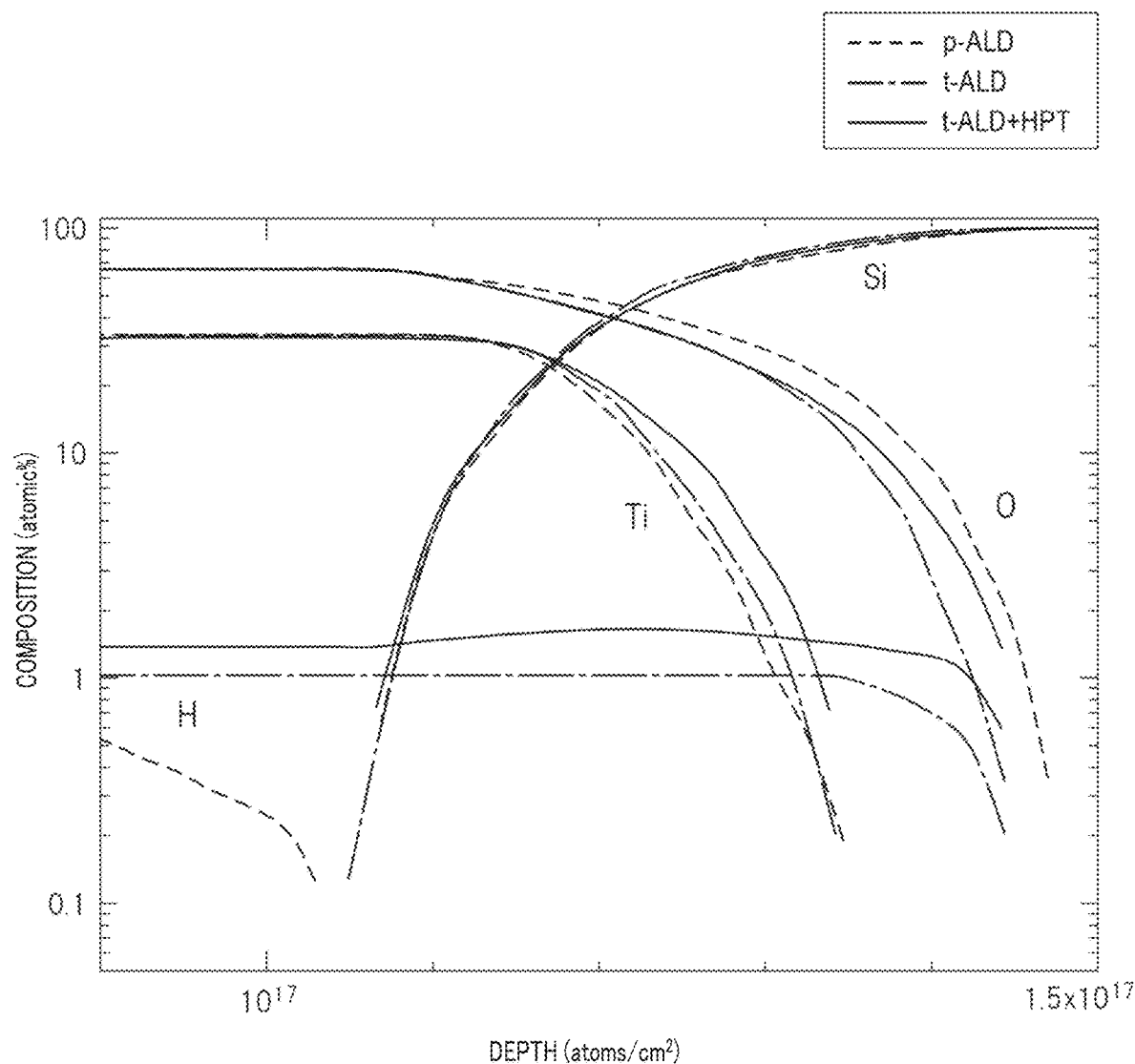
FIG. 10 is a graph in which the vertical axis of FIG. 9 is logarithmically displayed for better understanding of the difference in hydrogen concentration.

FIGS. 9 and 10 show the results of the quantitative analysis. In FIGS. 9 and 10, a dotted line represents a titanium oxide film formed by the plasma atomic layer deposition method (p-ALD). A dashed-dotted line represents a titanium oxide film formed by the thermal atomic layer deposition method but not subjected to hydrogen plasma treatment (t-ALD). A solid line represents a titanium oxide film formed by the thermal atomic layer deposition method and subjected to hydrogen plasma treatment (t-ALD+HPT).

The RBS and ERDA analyses are performed after annealing a sample composed of a light transmissive electrode (ITO film) (10 nm)/titanium oxide film (5 nm)/crystalline silicon layer, which has a structure similar to that of an actual solar cell, in a low vacuum at a temperature of 180° C. It is confirmed that the performance of a solar cell can be reproduced by adding more ITO films after annealing, even with this special sample structure having a thin ITO film. This is identical to the measurements of the composition of the titanium oxide film and the interlayer film of an actual solar cell.

As shown in FIGS. 9 and 10, in a titanium oxide film formed under any of the deposition conditions, the oxygen/titanium ratio (O/Ti ratio) of the titanium oxide film is 2, which is close to the stoichiometric ratio. On the other hand, the interlayer film formed at the interface between the crystalline silicon layer and the titanium oxide film is composed of a film containing titanium element (Ti), oxygen element (O), and silicon element (Si), and this composition seems to be strongly dependent on the deposition conditions and hydrogen plasma treatment. FIG. 9 shows that, for example, the titanium oxide film (including the interlayer film) formed by the thermal atomic layer deposition method has a lower oxygen concentration (while the silicon concentration is higher) in the interlayer film than the titanium oxide film (including the interlayer film) formed by the plasma atomic layer deposition method. The distribution of the titanium element and the oxygen element in the interlayer film also tend to spread in the depth direction by applying the hydrogen plasma treatment. FIG. 10 shows that the titanium oxide film (including the interlayer film) formed by the thermal atomic layer deposition method contains hydrogen element mainly in the interlayer film, and the hydrogen concentration in the interlayer film is increased by performing hydrogen plasma treatment. On the other hand, little hydrogen is detected in the titanium oxide film (including the interlayer film) formed by the plasma atomic layer deposition method.

Next, for examining the composition of titanium oxide formed on the crystalline silicon layer having the (111) faceted surface, the composition analysis of the titanium oxide film formed on the crystalline silicon layer having the flat (111) surface is performed by RBS and ERDA. As the passivation properties and hole selectivity of a titanium oxide film satisfy the following relationship: flat (100) surface>(111) faceted surface>flat (111) surface as shown in FIG. 7, the composition of titanium oxide film deposited on the (111) faceted surface can be easily assumed to also follow this relationship.

FIG. 11 shows the comparison between the solar cell properties and the composition of the interlayer film in the titanium oxide films formed on the crystalline silicon layers having different surface orientations by different methods. The composition of an interlayer film is defined by the oxygen concentration, the silicon concentration, and the hydrogen concentration at a depth where a ratio of the titanium atomic % concentration in the interlayer film to the maximum titanium atomic % concentration in the titanium oxide film is 0.5. In FIG. 11, "Jsc," "Voc," "FF," and "Eff." represent the solar cell properties, namely "short-circuit current density ($mA/cm^2$)," "open circuit voltage (V)," "fill factor," and "conversion efficiency (%)," respectively.

From FIG. 11, the reason why titanium oxide films having excellent hole selectivity and excellent passivation properties can be obtained by, for example, the producing method of the present embodiment 1 (where a titanium oxide film formed by the thermal atomic layer deposition method and subjected to hydrogen plasma treatment) may be concluded mainly from the following factor. In the interface structure (interlayer film) between the crystalline silicon layer and the titanium oxide film, (1) the interlayer film has a low oxygen concentration and a high silicon concentration, and (2) the interlayer film contains hydrogen element. Specifically, employing the features in the producing method of the present embodiment 1 can achieve the following: an interlayer film, which is formed at the interface between the crystalline silicon layer and the silicon oxide layer, containing 1.5 atomic % or more of hydrogen element; and an interface structure having the oxygen concentration of 45 atomic % or less at a depth where the ratio of the titanium atomic % concentration in the interlayer film to the maximum titanium atomic % concentration in the titanium oxide film is 0.5, and the silicon concentration of 36 atomic % or more at the same depth Therefore, the combination of the interlayer film and the titanium oxide film in the present embodiment 1 enables the obtainment of a hole selective film having both excellent hole selectivity for selectively allowing holes generated in crystalline silicon to pass through, and excellent passivation properties for suppressing the recombination of electrons and holes.

Effect in Embodiment 1

The solar cell in the present embodiment 1 is a carrier selective solar cell including a crystalline silicon layer having a first main surface, an interlayer film provided on the first main surface and containing silicon, titanium, and oxygen, a titanium oxide film provided on the interlayer film, and a light transmissive electrode provided on the titanium oxide film. In the carrier selective solar cell of the present embodiment, the above-described interlayer film and titanium oxide film serve as a hole transport film for the crystalline silicon layer. In other words, the combination of the interlayer film and the titanium oxide film function as a hole selective film. The carrier selective solar cell of the present embodiment 1 can obtain a conversion efficiency of 18% or more by virtue of the formation of the interface structure having a composition as described in the above description of "Examination Results of Interface Structure." That is, employing the features in the producing method according to the present embodiment 1 can achieve a titanium oxide film including the above-described interface structure, thereby obtaining a hole selective film that has both suitable hole selectivity and suitable passivation properties from the titanium oxide film. From the foregoing, the present embodiment 1 can provide a carrier selective solar cell with a titanium oxide film as the hole selective film, and the carrier selective solar cell has an excellent feature of a high conversion efficiency of 18% or more.

For example, at the present stage, the solar cell that achieves the highest conversion efficiency among the solar cells with crystalline silicon layers is a heterojunction solar cell. This high conversion efficiency is largely due to the excellent passivation properties of a hydrogen-containing amorphous silicon film used in the heterojunction solar cell and the controllability of carrier selectivity by doping. However, the band gap of amorphous silicon is about 1.7 eV, and thus the amorphous silicon film has a high light absorption coefficient in the visible light region. Most of the light absorbed by the amorphous silicon film results in a loss of energy conversion.

The carrier selective solar cell of the present embodiment 1 meanwhile has no amorphous silicon buffer layer between the crystalline silicon layer and the titanium oxide film. More specifically, the carrier selective solar cell has no amorphous silicon buffer layer between the crystalline silicon layer and the interlayer film. This is because the combination of the titanium oxide film and the interlayer film in the present embodiment 1 achieves both suitable hole selectivity and suitable passivation properties, and thus no amorphous silicon buffer layer is necessary between the films for improving the passivation properties. Titanium oxide used in the carrier selective solar cell of the present embodiment 1 has the band gap of about 3.4 eV, and is almost completely transparent in the visible light region. This property of titanium oxide allows a carrier selective solar cell with a titanium oxide film used as a hole selective film to have excellent short wavelength sensitivity. The carrier selective solar cell with a titanium oxide film having an interface structure of the present embodiment 1 used as a hole selective film does not require an amorphous silicon buffer layer, resulting in excellent short wavelength sensitivity. The carrier selective solar cell is thus capable of obtaining high short-circuit current density.

Specifically, FIG. 12 is a graph showing the relationship between the wavelength of incident light and external quantum efficiency.

The dotted line in FIG. 12 represents the external quantum efficiency spectrum of a heterojunction solar cell. The hole selective film of the heterojunction solar cell is composed of a film (a-Si: H i-p) in which an intrinsic hydrogenated amorphous silicon film (thickness: 6 nm) and a p-type hydrogenated amorphous silicon film (film thickness: 3 nm) are stacked. The solid line in FIG. 12 represents the external quantum efficiency spectrum of a carrier selective solar cell with a titanium oxide film of the present embodiment 1 used as a hole selective film. FIG. 12 shows that due to the light transmissive property of titanium oxide in the visible light range, the short wavelength sensitivity of the carrier selective solar cell of the present embodiment 1, represented by the solid line, is greatly improved compared to that of the conventional heterojunction solar cell, represented by the dotted line. As a result, the carrier selective solar cell with a titanium oxide film of the present embodiment 1 used as a hole selective film can obtain a higher short-circuit current density than the conventional heterojunction solar cell with an amorphous silicon film. For example, the short-circuit current density of the conventional heterojunction solar cell is 38.8 mA/cm$^2$, whereas the short-circuit current density of the carrier selective solar cell in the present embodiment 1 is as high as 40.2 mA/cm$^2$. A solar cell having a higher short-circuit current density means the solar cell achieves a better performance. The carrier selective solar cell with a titanium oxide film of the present embodiment 1 used as a hole selective film thus has the potential to exceed a conventional heterojunction solar cell with an amorphous silicon film in its performance.

In addition to titanium oxide, which is light transmissive in the visible light region, examples of the material for a hole selective film that is light transmissive in the visible light region include molybdenum oxide, tungsten oxide, and vanadium oxide. However, these metal oxides are not suitable for obtaining a high open circuit voltage because of their low passivation properties when used as a hole selective film. Therefore, for using each of these metal oxides as a hole selective film, a buffer layer represented by an amorphous silicon film with excellent passivation properties is required between the metal oxide film and a crystalline silicon layer for obtaining sufficient passivation properties. The above configuration makes the improvement of the conversion efficiency difficult because of the light absorption loss caused by the buffer layer, and also makes the process of producing the solar cell complicated. In contrast, the present embodiment utilizes a titanium oxide film as a hole selective film that has both suitable hole selectivity and suitable passivation properties by employing a particular method for forming the titanium oxide film. Furthermore, the synergistic effect of this feature and the property of titanium oxide, that is, light transmissive in the visible light range allows for the obtainment of a carrier selective solar cell having a conversion efficiency superior to that of a carrier selective solar cell with another metal oxide used as a hole selective film. In this respect, the technical idea in the present embodiment 1 opens the way for the practical application of a carrier selective solar cell capable of achieving a higher conversion efficiency than the heterojunction solar cell having the highest conversion efficiency at the present stage. In that respect, it can be said that the technical idea of the present embodiment has great technical significance.

FIG. 13 is a table showing an actual comparison between the present embodiment and typical examples of a front emitter solar cell of a related art in which a hole selective film is provided on the light incident surface side of a n-type crystalline silicon layer (light absorbing layer) among solar cells with hole selective films made of various materials.

The graph shows the results, for example, for solar cells with a hole selective film provided on the light incident side and an electron selective film using an amorphous silicon film (a-Si: H i-n) or polycrystalline silicon film (SiOx/poly-Si n) placed on the back surface side, corresponding to the devices illustrated in FIG. 1 (planar) and FIG. 2 (texture) which use n-type crystalline silicon layers as crystalline silicon layers 10.

In FIG. 13, shaded items represent the present embodiment. FIG. 13 shows that the performance of solar cells with titanium oxide in the present embodiment are superior as compared to other metal oxides (such as molybdenum oxide, tungsten oxide, and vanadium oxide) which have been used as hole selective films. From the going, the present embodiment presents the possibility that carrier selective solar cells can achieve performance that surpasses that of heterojunction solar cells, and suggests practical application of solar cells that can achieve both reduction of performance costs by simplifying the production process and improvement of performance of solar cells represented by improvement of conversion efficiency. In this regard, the present embodiment has great technical significance.

MODIFICATIONS

In the following, modifications of Embodiment 1 will be described.

Modification 1

Figure 14:
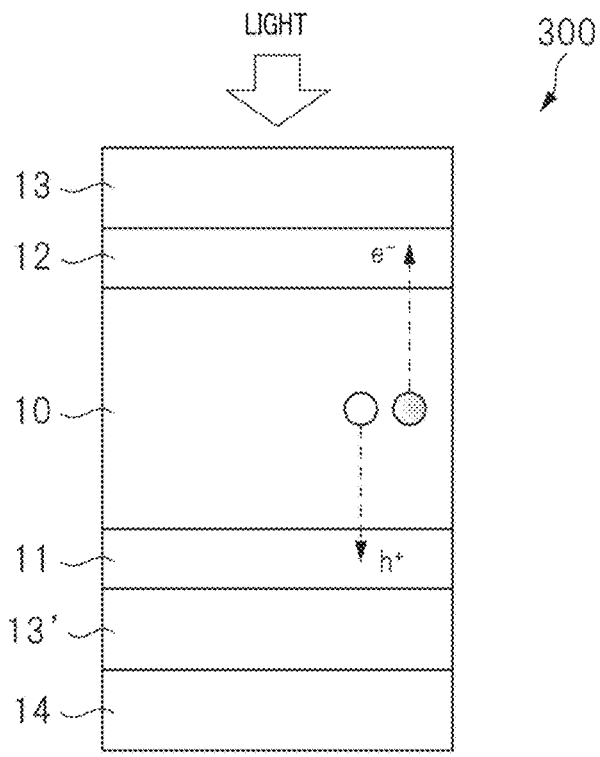
FIG. 14 illustrates a schematic device structure of a carrier selective solar cell in modification 1.

FIG. 14 illustrates a schematic device structure of a carrier selective solar cell in the present modification 1. In FIG. 14, a titanium oxide film, which is hole selective film 11, is formed on the back surface of crystalline silicon layer 10, and a second light transmissive electrode 13' is formed so as to be in contact with the titanium oxide film in carrier selective solar cell 300 of the present modification 1. The back surface is on the opposite side of the front surface (which is on the light incident surface side) of crystalline silicon layer 10. Carrier selective solar cell 300 of the present modification 1 configured as described above can also have improved performance because the titanium oxide film is employed as a hole selective film having suitable hole selectivity and suitable passivation properties.

Modification 2

Figure 15:
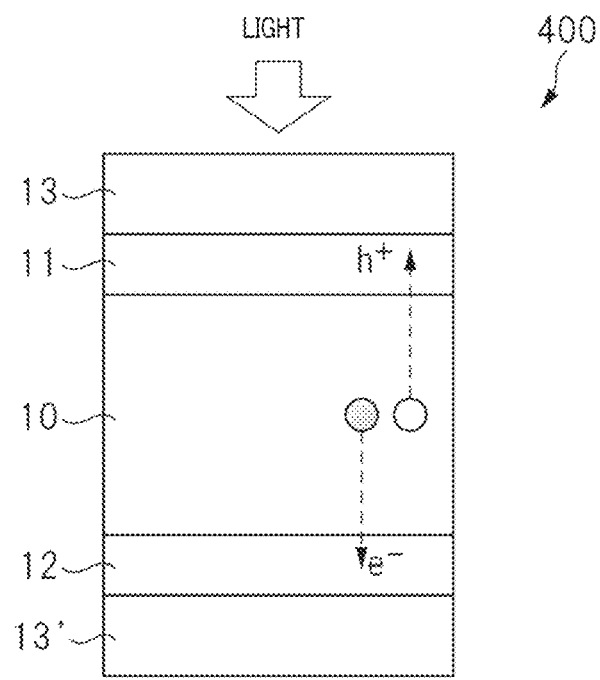
FIG. 15 illustrates a schematic device structure of a carrier selective solar cell in modification 2.

FIG. 15 illustrates a schematic device structure of a carrier selective solar cell in the present modification 2. In FIG. 15, carrier selective solar cell 400 of the present modification 2 is configured such that light enters carrier selective solar cell 400 from both the front surface of crystalline silicon layer 10 and the back surface of crystalline silicon layer 10. Carrier selective solar cell 400 of the present modification 2 configured as described above can also have improved performance because the titanium oxide film is employed as a hole selective film having suitable hole selectivity and suitable passivation properties.

Modification 3

Figures 16, 17:
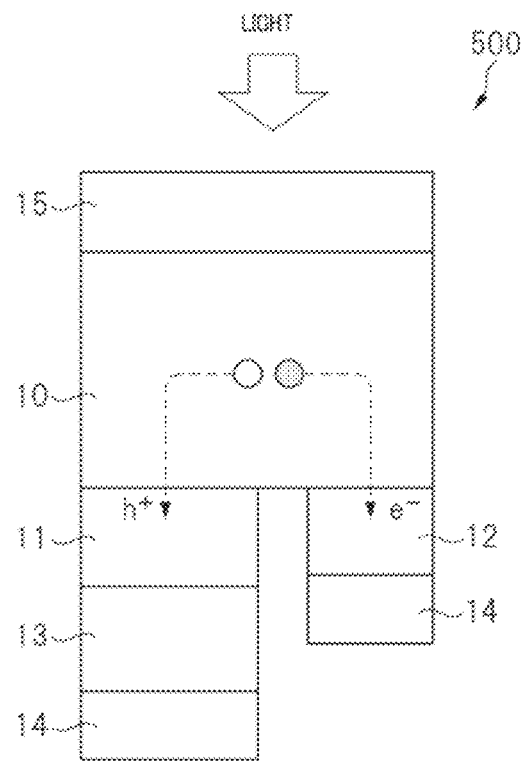
FIG. 16 illustrates a schematic device structure of a carrier selective solar cell in modification 3.
FIG. 17 is a table showing the relationship between the configuration of a carrier selective solar cell in modification 4 and the solar cell properties thereof.

FIG. 16 illustrates a schematic device structure of a carrier selective solar cell in the present modification 3. In FIG. 16, passivation film 15 made of, for example, an insulating film that is light transmissive for visible light is formed on the front surface of crystalline silicon layer 10 in carrier selective solar cell 500 of the present modification 3 (the front surface of crystalline silicon layer 10 is on the light incident surface side). Meanwhile, a titanium oxide film (which is hole selective film 11) and electron selective film 12 are formed on the back surface of crystalline silicon layer 10, i.e., on the opposite side of the front surface. In addition, light transmissive electrode 13 is formed so as to come into contact with the titanium oxide film in carrier selective solar cell 500 of the present modification 3. Metal electrodes 14 are formed so as to come into contact with electron selective film 12 and light transmissive electrode 13, respectively. Carrier selective solar cell 500 of the present modification 3 configured as described above can also have improved performance because the titanium oxide film is employed as a hole selective film having suitable hole selectivity and suitable passivation properties.

Modification 4

The above embodiment describes an example in which, for example, an n-type crystalline silicon layer is used as crystalline silicon layer 10 illustrated in FIG. 1, but the technical idea of the embodiments is not limited to this configuration. A p-type crystalline silicon layer can also be used as crystalline silicon layer 10.

For example, also in a case of using a p-type crystalline silicon layer as crystalline silicon layer 10, the following configurations are possible: a carrier selective solar cell with a rear-emitter structure in which a titanium oxide film is formed as a hole selective film on the light receiving surface side (front surface side); and a carrier selective solar cell with a front-emitter structure in which a titanium oxide film is formed as a hole selective film on the back surface side.

FIG. 17 shows the performance results of carrier selective solar cells with a p-type crystalline silicon layer. Produced solar cells are samples, for example, with a p-type crystalline silicon layer used as crystalline silicon layer 10 and based on the devices of FIG. 1 (planar) and FIG. 2 (texture) as follows: a sample in which a titanium oxide film is provided on the light incident surface side and used as the "FSF (front surface field)"; and a sample in which a titanium oxide film is provided on the back surface side and used as the "BSF (back surface field)." An amorphous silicon film (a-Si: H i-n) is used as an electron selective film.

FIGS. 13 to 17 show that the titanium oxide films formed by the production method of the present embodiment have suitable hole selectivity and suitable passivation properties regardless of the polarity of the crystalline silicon in the carrier selective solar cell.

The conversion efficiency of the carrier selective solar cells with the p-type crystalline silicon layer in FIG. 17 is lower than the conversion efficiency of the carrier selective solar cells with the n-type crystalline silicon layer of FIG. 13. The reason therefor can be attributed to the fact that the quality (such as defect density) of the p-type crystalline silicon substrates is not as good as the quality (defect density) of the n-type crystalline silicon substrates.

Modification 5

For example, a texture structure may be formed on both the front surface and the back surface of each crystalline silicon layer 10 illustrated in FIGS. 1 and 14 to 16. Alternatively, a texture structure may be formed on only one of the light incident surface side and the back surface side of crystalline silicon layer 10. A solar cell having a texture structure formed on only one side thereof can be used, for example, as a bottom cell of a tandem type solar cell.

Embodiment 2

Embodiment 1 describes an example in which the titanium oxide film formed by the production method in embodiment 1 is used as the hole selective film of a solar cell, but the technical idea of embodiment 1 is not limited to this configuration. For example, the technical idea of embodiment 1 can be applied to a semiconductor device.

Specifically, the present embodiment 2 describes an example in which a titanium oxide film formed by the production method in embodiment 1 is applied to a structure for hole extraction from the source region and the drain region of a p-channel field effect transistor.

Figure 18:
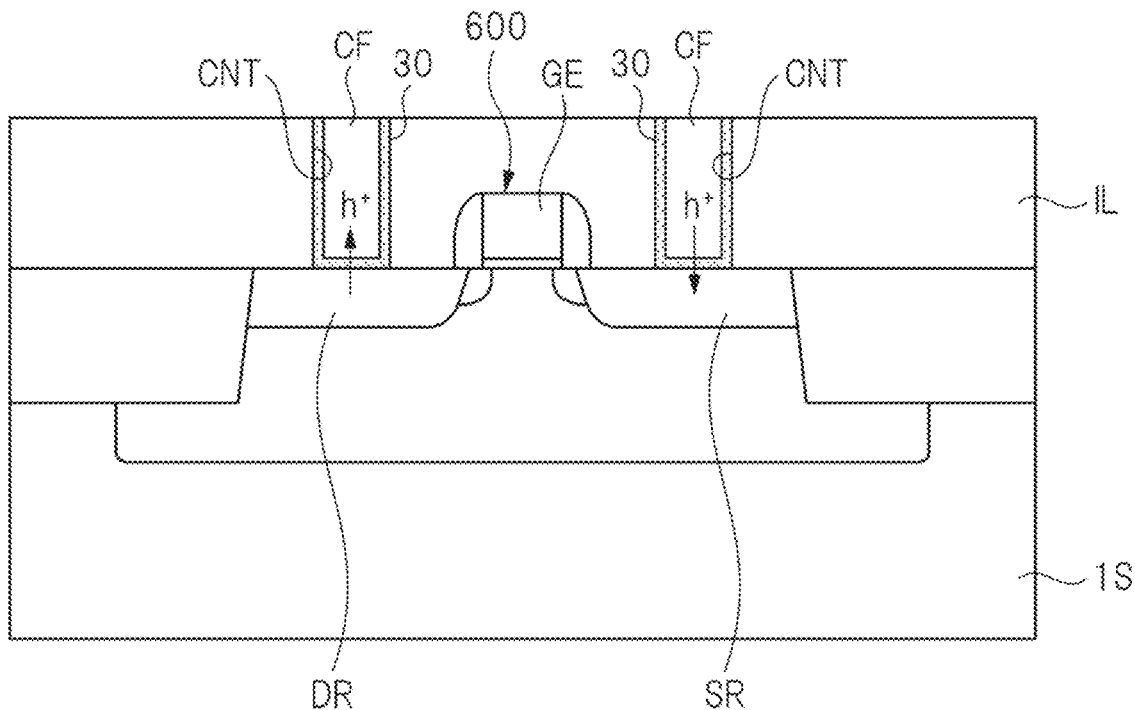
FIG. 18 illustrates a schematic structure of a semiconductor device including a p-channel field effect transistor.

FIG. 18 illustrates a schematic structure of a semiconductor device including a p-channel field effect transistor. As illustrated in FIG. 18, for example, p-channel field effect transistor 600 including gate electrode GE, source region SR, and drain region DR is formed on semiconductor substrate 1S composed of crystalline silicon. In p-channel field effect transistor 600, each of source region SR and drain region DR is composed of a p-type silicon region. An interlayer insulating film IL is formed so as to cover p-channel field effect transistor 600, and contact holes CNT are formed in interlayer insulating film IL. Contact holes CNT pass through interlayer insulating film IL to reach source region SR and drain region DR. In contact hole CNT, contact film 30 in contact with source region SR or drain region DR, and conductor film CF composed of, for example, a tungsten film are embedded to form a plug.

The titanium oxide film formed by the production method of embodiment 1 is used as contact film 30 in the present embodiment 2. In the following, the advantage from the configuration will be described.

For example, when conductor film CF embedded in contact hole CNT is in direct contact with the p-type silicon region constituting source region SR in FIG. 18, a material that makes ohmic contact with the p-type silicon region constituting source region SR is used as conductor film CF. Actually, however, suitable ohmic contact between conductor film CF and p-type silicon region may not always be formed due to, for example, defects generated at the interface between conductor film CF and p-type silicon region. In this case, the contact resistance between conductor film CF and p-type silicon region would increase, thereby reducing the performance of the semiconductor device.

In this regard, a titanium oxide film formed by the production method in embodiment 1 has suitable hole selectivity and suitable passivation properties. Disposing contact film 30 consisting of this titanium oxide film between, for example, conductor film CF and p-type silicon region constituting the source region SR as illustrated in FIG. 18 can thus facilitate the flow of hole current between the plug and source region SR. In other words, disposing the titanium oxide film formed by the production method in embodiment 1 between a plug and source region SR as contact film 30 can reduce the contact resistance between the plug and source region SR. That is, forming contact film 30 composed of an interlayer film and the titanium oxide film between, for example, conductor film CF and source region SR can reduce the contact resistance between the plug and source region SR. The present embodiment 2 can thus improve the performance of a semiconductor device by reducing the contact resistance with the presence of the titanium oxide film.

Embodiment 3

Findings Acquired by Present Inventors

The findings acquired from the technical ideas of embodiment 1 is as follows: the passivation properties of the titanium oxide film are greatly affected by the hydrogen element concentration and oxygen element concentration in the interlayer film formed at the interface between the crystalline silicon layer and the titanium oxide film. Specifically, findings such that the passivation properties of the titanium oxide film can be improved by increasing the hydrogen element concentration and the oxygen element concentration of the interlayer film to some extent can be obtained from embodiment 1.

In this regard, embodiment 1 focuses on applying a titanium oxide film to a hole selective film that needs to achieve both improvement of passivation properties and improvement of hole selectivity. In this case, the oxygen element concentration in the interlayer film formed at the interface between the crystalline silicon layer and the titanium oxide film cannot be increased more than necessary. The reason for the above limitation is that increasing the oxygen element concentration of the interlayer film increases the electrical resistance of the titanium oxide film (hole selective film) including the interlayer film, thereby reducing the fill factor of the solar cell and thus reducing the conversion efficiency.

By focusing only on the improvement of passivation properties regardless of hole selectivity, the present inventors have acquired the findings that it is desirable to increase the oxygen element concentration in the interlayer film to some extent. These findings are supported, for example, by the study results in embodiment 1. That is, the findings are supported by the description: "the present inventors' study has revealed that (1) when annealing is performed in an atmosphere containing oxygen after a light transmissive electrode is formed on or above the titanium oxide film, the passivation properties and the hole selectivity of the titanium oxide film are both improved. In this regard, (2) when the annealing is performed in an atmosphere containing oxygen before the light transmissive electrode is formed on or above the titanium oxide film, the passivation properties of the titanium oxide film is greatly improved, but the fill factor of the solar cell is significantly reduced."

For example, for a film that does not require improvement in hole selectivity but requires improvement in passivation properties, it would thus be desirable to increase the oxygen element concentration in the interlayer film thereof to some extent, compared to a film that requires improvement in both hole selectivity and passivation properties.

The present embodiment 3 thus achieves a particular configuration based on the above described findings, for example, to improve the passivation properties of a passivation film for mainly covering the surface of a crystalline silicon film, rather than an electron selective film that extracts electrons or a hole selective film that extracts holes.

In the following, the technical idea of the present embodiment 3 using such a configuration will be described.

Basic Idea in Embodiment 3

The basic idea in embodiment 3 is to perform hydrogen plasma treatment so as to increase the concentration of hydrogen element in an interlayer film formed at the interface between a crystalline silicon layer and a passivation film. Specifically, the basic idea in embodiment 3 is as follows: based on the premise that the passivation film is configured from a film stack of a first titanium oxide film and a second titanium oxide film, the hydrogen plasma treatment is performed on the first titanium oxide film at least in a stage after forming the first titanium oxide film and before forming the second titanium oxide film.

According to such a basic idea, the hydrogen plasma treatment is performed on the passivation film having a small film thickness, thereby increasing the hydrogen element concentration of an interlayer film. As a result, the direct and indirect effects acquired by increasing the hydrogen element concentration of the interlayer film according to the basic idea can improve the passivation properties of the passivation film.

In the following, the direct effect acquired by increasing the hydrogen element concentration in the interlayer will be described. For example, the dangling bonds residing at the interface between the crystalline silicon layer and the titanium oxide film is terminated by the hydrogen element mixed in the interlayer film. As a result, carrier recombination caused by dangling bonds is suppressed, which is considered to improve the passivation properties of the passivation film. In other words, as the concentration of hydrogen element in the interlayer increases, the number of hydrogen element that can terminate the dangling bonds may increase, thereby improving the passivation properties of the passivation film through a significant suppression of the recombination of electrons and holes caused by the dangling bonds. The effect described above is a direct effect brought about by increasing the hydrogen element concentration in the interlayer film.

Then, the indirect effect acquired by increasing the hydrogen element concentration in the interlayer will be described. For example, when the hydrogen element is mixed in the interlayer film, the hydrogen element reduces the oxygen element contained in the interlayer film, thereby lowering the amount of the oxygen element contained in the interlayer film. Then, for example, annealing is performed in an atmosphere containing oxygen after forming the passivation film. During this procedure, the smaller the amount of oxygen element contained in the interlayer film, the larger the amount of oxygen element incorporated into the interlayer film by performing annealing in the atmosphere containing oxygen. This is because regarding the amount of oxygen element to be incorporated during the annealing in the atmosphere containing oxygen, the greater the difference in concentration between the initial oxygen element concentration in the interlayer and the oxygen element concentration in the atmosphere containing oxygen, the more rapidly the oxygen element is incorporated into the interlayer.

Herein, an increase in the hydrogen element concentration in the interlayer film means that the amount of reduction of the oxygen element in the interlayer film is increased, thereby lowering the initial oxygen element concentration in the interlayer film. As a result, the concentration difference between the initial oxygen element concentration in the interlayer film and the oxygen element concentration in the atmosphere containing oxygen increases. When annealing is performed in the atmosphere containing oxygen, the oxygen element would be thus rapidly incorporated into the interlayer film. It is considered that increasing the concentration of the oxygen element contained in the interlayer film at the final stage thus can improve the passivation properties of a passivation film according to the basic idea. This effect is an indirect effect brought about by increasing the concentration of hydrogen element in the interlayer film.

From the foregoing, the synergistic effect of the direct effect and the indirect effect can improve the passivation properties of a passivation film according to the basic idea in embodiment 3.

In particular, the basic idea in embodiment 3 is novel in the following point: the hydrogen plasma treatment can not only increases the hydrogen element concentration in an interlayer film, but also increase the oxygen element concentration in the interlayer film by being combined with the subsequent annealing in an atmosphere containing oxygen. The novel idea can only be conceived by understanding the mechanism of how the above-described indirect effect can be obtained.

In the following, a specific mode that embodies the basic idea will be described.

Structure of Back Surface Electrode Solar Cell

Figure 19:
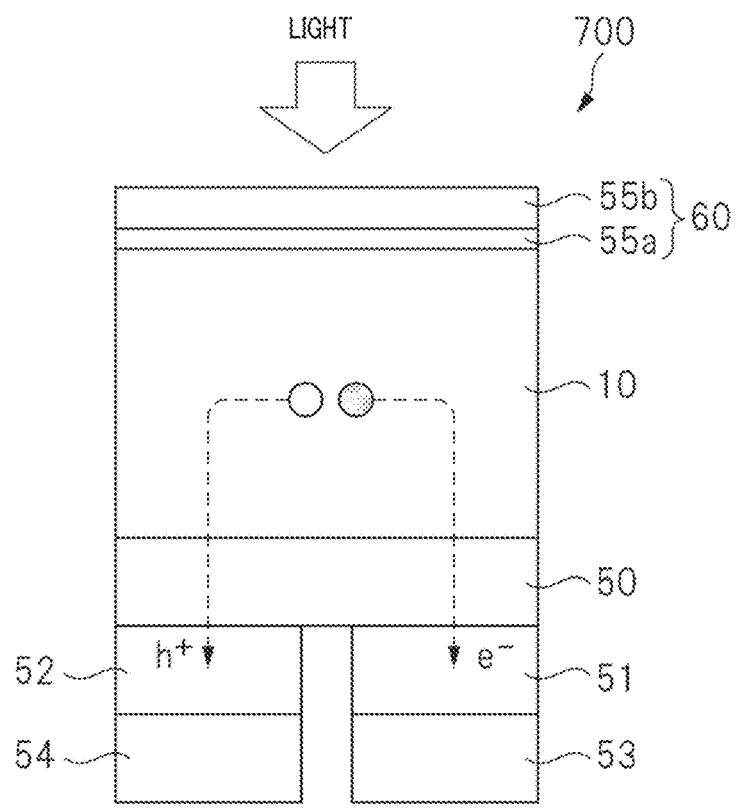
FIG. 19 illustrates the structure of a solar cell with electrode(s) on the back surface (herein also referred to as "back surface electrode solar cell") in Embodiment 3.

FIG. 19 illustrates the structure of a back surface electrode solar cell in the present embodiment 3. As illustrated in FIG. 19, back surface electrode solar cell 700 includes crystalline silicon layer 10, first passivation film 50, non-passivation electron selective film 51, non-passivation hole selective film 52, cathode electrode (first electrode) 53, and anode electrode (second electrode) 54. In FIG. 19, film 50 is formed on, for example, the back surface of crystalline silicon layer 10 and films 51 and 52 are formed so as to be in contact with film 50 (the back surface is a non-light receiving surface). Electrodes 53 and 54 are formed so as to be in contact with films 51 and 52, respectively.

For example, an n-type hydrogenated amorphous silicon film (a-Si: H) or the like is used as non-passivation electron selective film 51. As non-passivation hole selective film 52, meanwhile, a p-type hydrogenated amorphous silicon film (a-Si: H) or the like is used. Metal electrodes such as silver films are used for cathode electrode 53 and anode electrode 54. In addition, in order to enhance the reflection of light, a metal oxide film such as an ITO electrode (light transmissive electrode) may be disposed at the interface between the silver film and the n-type hydrogenated amorphous silicon film or the p-type hydrogenated amorphous silicon film. For first passivation film 50, an i-type hydrogenated amorphous silicon film (a-Si: H) is used.

Second passivation film 60 is formed on the front surface (which is a light receiving surface) of crystalline silicon layer 10. The polarity of crystalline silicon layer 10 may be n-type or p-type, and the surface structure of crystalline silicon layer 10 may be a flat structure composed of a silicon (100) surface or a random texture structure composed of a (111) faceted surface. An antireflection film composed of, for example, a silicon nitride film may also be formed on or above second passivation film 60.

In FIG. 19, second passivation film 60 is formed on the front surface opposite to the back surface on which cathode electrode 53 and anode electrode 54 are formed. Therefore, this film 60 is not required to function as an electrode, but is required to have passivation properties for suppressing the recombination of electrons and holes mainly at the interface with the crystalline silicon film. From the above point of view, the basic idea in embodiment 3, namely a particular configuration to improve the passivation properties, can be applied to film 60. Specifically, as illustrated in FIG. 19, second passivation film 60 is composed of a film stack of first titanium oxide film 55a and second titanium oxide film 55b. An interlayer film is formed between crystalline silicon layer 10 and first titanium oxide film 55a. This interlayer film contains silicon, titanium and oxygen, and further contains 1.5 atomic % or more of hydrogen.

As an additional property required for second passivation film 60 formed on the light receiving surface, it is desired that second passivation film 60 is transparent as much as possible from the visible light to near infrared region. For example, a heterojunction solar cell includes a passivation film composed of a hydrogenated amorphous silicon film (a-Si: H) and a hydrogenated amorphous silicon nitride film (a-SiNx: H) stacked in sequence on the surface of a crystalline silicon layer (see NPL 10). In this configuration, the hydrogenated amorphous silicon film absorbs visible light having a wavelength of 700 nm or less, which leads to a loss of energy conversion. In this regard, the present embodiment 3 employs a titanium oxide film that is light transmissive for second passivation film 60. As a result, back surface electrode solar cell 700 can effectively convert light having entered from a sun light receiving surface into energy.

Method for Producing Back Surface Electrode Solar Cell

In the following, a method for producing back surface electrode solar cell 700 will be described.

Figures 20, 21:
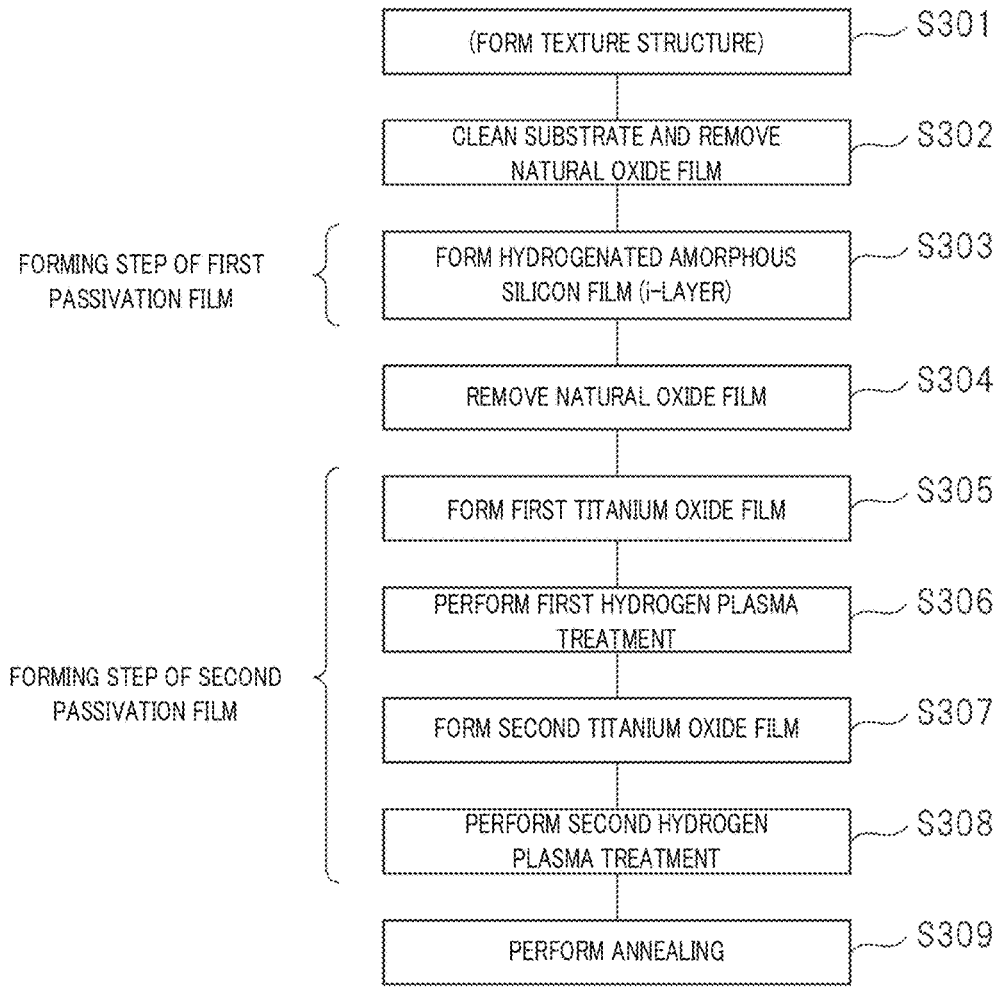
FIG. 20 is a flow chart explaining the flow of the producing process of the back surface electrode solar cell in Embodiment 3.
FIG. 21 is a table explaining the superiority of the passivation properties of a second passivation film in Embodiment 3.

FIG. 20 is a flow chart explaining the flow of the producing process of the back surface electrode solar cell in Embodiment 3. The steps for producing non-passivation electron selective film 51, non-passivation hole selective film 52, cathode electrode 53, and anode electrode 54 illustrated in FIG. 19 do not directly affect the passivation properties, and are thus omitted in FIG. 20. An example of the step for producing these films is a procedure such that after forming the hydrogenated amorphous silicon film (i layer) (S303), films 51 and 52 illustrated in FIG. 19 are formed, and after annealing (S309), electrodes 53 and 54 are formed. Another example of the step for producing these films is a procedure such that after annealing (S309), films 51 and 52 and electrodes 53 and 54 illustrated in FIG. 19 are formed.

In FIG. 20, the step of forming a texture structure (S301) and the step of cleaning the substrate and removing the natural oxide film (S302) are the same as those in embodiment 1, and thus the description thereof will be omitted.

An i-type hydrogenated amorphous silicon film having suitable passivation properties is then formed as first passivation film 50 on the back surface (on the side opposite to the light incident surface) of crystalline silicon layer 10 by, for example, using a plasma chemical vapor deposition (CVD) method (S303).

The natural oxide film formed on the front surface (on the light incident surface side) of crystalline silicon layer 10 is then removed by using dilute hydrofluoric acid on crystalline silicon layer 10 again (S304).

Second passivation film 60 is then formed on the front surface of crystalline silicon layer 10, i.e., on the light incident surface. Specifically, first titanium oxide film 55a is formed (S305). The film 60 was formed as a titanium oxide film by using the thermal atomic layer deposition method in the same manner as in embodiment 1 under the same conditions, except that the "ALD cycle number" of the first titanium oxide film is 39 times (thickness: 1.5 nm).

First hydrogen plasma treatment for irradiating the front surface of first titanium oxide film 55a with hydrogen plasma is then performed (S306). The hydrogen flow rate and pressure in this procedure are the same as those of embodiment 1, except that the discharge power is 300 W and the irradiation time is 30 seconds.

Second titanium oxide film 55b is then formed by the thermal atomic layer deposition method again to increase the thickness of second passivation film 60 (S307). The "ALD cycle number" in this procedure is 128−39=89 times (thickness: 3.5 nm), and the sum of the "ALD cycle numbers" in the film formation steps of first and second titanium oxide films 55a and 55b is the same as the "ALD cycle number" performed in embodiment 1.

The hydrogen plasma treatment is then performed again, which is referred to as second hydrogen plasma treatment (S308). The conditions for the second hydrogen plasma treatment are the same as those in embodiment 1, except that the irradiation time is 30 minutes.

As the last step, annealing is performed in an oven at 180° C. for 2 hours (S309). Annealing is performed in a low vacuum or in an atmosphere containing oxygen, such as air.

Back surface electrode solar cell 700 including second passivation film 60 of the present embodiment 3 can be produced as described above. In other words, the present embodiment 3 has features in the producing method as follows: (1) first titanium oxide film 55a is formed directly on the surface of crystalline silicon layer 10 by a thermal atomic layer deposition method, (2) first hydrogen plasma treatment is performed on first titanium oxide film 55a, (3) second titanium oxide film 55b is formed by the thermal atomic layer deposition method again, (4) the second hydrogen plasma treatment is performed again, and (5) annealing is performed in an atmosphere containing oxygen. As a result, the film stack of first and second titanium oxide films 55a and 55b directly formed on crystalline silicon layer 10 becomes a film having suitable passivation properties. In the following, the results of the examination on the above features will be described.

As described below in the description for the samples #2 to #4 shown in FIG. 21, the step of second hydrogen plasma treatment (S308) in the steps for forming second passivation film 60 (S305 to S308) may be omitted in the present embodiment 3. However, from the viewpoint of improving the passivation properties of second passivation film 60, it is desirable to perform both the first hydrogen plasma treatment step (S306) and the second hydrogen plasma treatment step (S308).

Examination Results

FIG. 21 is a table showing the passivation properties of the second passivation films when, for example, a crystalline silicon layer having a random texture structure composed of a (111) faceted surface is used. For the evaluation of the passivation properties, the element structure before the solar cell is completed is used. Specifically, a sample of FIG. 19 having a structure in which crystalline silicon layer 10 was placed between first passivation film 50 on the back surface side and second passivation film 60 on the front surface side is prepared. The passivation properties are evaluated by measuring the hole lifetime of the sample.

For examining the effects of the stacked structure of the titanium oxide films and repeating of the hydrogen plasma treatment, FIG. 21 shows the hole lifetime (injection carrier density: $10^{15}/cm^3$) in the crystalline silicon layers of the six samples #1 to #6.

Sample #1 (comparative example) is obtained from a sample of FIG. 20 by not performing the steps of first hydrogen plasma treatment (S306) and second hydrogen plasma treatment (S308), but continuously performing the steps of film formation (S305) of a first titanium oxide film and film formation (S307) of a second titanium oxide film. Sample #2 is obtained by not performing the step of S306, but performing the step of S308 after continuously performing the steps of S305 and S307. Sample #3 is obtained by sequentially performing the steps of S305 to S307 but not performing the step of S308 thereafter. Sample #4 is obtained by performing all the steps of S305 to S308.

Sample #5 is a comparative example in which a conventional i-type hydrogenated amorphous silicon film (a-Si: H) is used as a passivation film on both sides of the crystalline silicon layer. Sample #6 (comparative example) is obtained from a sample of FIG. 20 by performing the steps of S305 and S306 but not performing the steps of S307 and S308 thereafter.

The difference between the sample #1 and the sample #2 is the presence or absence of the hydrogen plasma treatment, which is equivalent to the effect of the hydrogen plasma treatment after the formation of the titanium oxide film shown in embodiment 1. FIG. 21 shows that the sample #2 has a hole lifetime increased about 9 times compared to the sample #1.

FIG. 21 also shows that the sample #3 has a dramatically improved hole lifetime compared to the sample #2, where the first hydrogen plasma treatment is performed between the steps of film formation of the first titanium oxide film and the second titanium oxide film for the sample #3, and the second hydrogen plasma treatment is performed after the step of film formation of the second titanium oxide film for the sample #2.

The sample #4 shows the highest hole lifetime value among the four samples (#1 to #4), where both the first hydrogen plasma treatment and the second hydrogen plasma treatment are performed for the sample #4. This value indicates that the passivation properties of the sample #4 are superior to those of the sample (sample #5) in which both sides of the crystalline silicon layer are passivated with an i-type hydrogenated amorphous silicon film (a-Si: H). The above results show that the maximum passivation properties can be obtained by performing the first hydrogen plasma treatment after the formation of a first titanium oxide film and before the formation of a second titanium oxide film, and performing the second hydrogen plasma treatment after the formation of the second titanium oxide film.

Similar to the present embodiment 3, a related art (see NPL 11) discloses a titanium oxide film used as a passivation film on the light receiving surface of a crystalline silicon solar cell. The titanium oxide film of the related art is prepared by a method corresponding to that of the sample #1 shown in FIG. 21. That is, the related art does not perform the first hydrogen plasma treatment and the second hydrogen plasma treatment as in the present embodiment 3, thus the hole lifetime is as low as 1 ms or less. The result of this related art is consistent with the result of the sample #1.

Among the samples #2, #3, and #4 with the hydrogen plasma treatment performed, the samples #3 and #4 have a significantly improved hole life as compared with the sample #2 equivalent to the sample examined in embodiment 1. The reason for the above difference can be considered as follows: the samples #3 and #4 have the first titanium oxide film to be subjected to the first hydrogen plasma treatment with the film thickness as small as 1.5 nm, as compared to the sample #2 whose titanium oxide film to be subjected to the hydrogen plasma treatment has the film thickness of 5 nm (1.5 nm+3.5 nm); and an increased amount of atomic hydrogen (hydrogen element) thus reaches an interlayer film formed at the interface between the first titanium oxide film and the crystalline silicon layer in the samples #3 and #4 so that the hydrogen plasma treatment gives a greater effect on the composition (titanium, oxygen, silicon) or the hydrogen content of the interlayer film. In other words, performing hydrogen plasma treatment on a thin titanium oxide film may be a major factor for improving passivation performance (increasing hole lifetime). At the very least, it is desirable to distribute the film thickness of the first and second titanium oxide films in such a way that the thickness of the first titanium oxide film is smaller than that of the second titanium oxide film. In particular, based on the findings for sample #2, it is important that the film thickness of the first titanium dioxide film be sufficiently smaller than 5 nm, but a range of approximately 0.5 nm or more and 2.5 nm or less seems to be a desirable range.

In addition, stacking the second titanium oxide film after the performance of the first hydrogen plasma treatment as in the sample #3 to set the thickness of the titanium oxide film the same as that of embodiment 1 can achieve a passivation performance exceeding the passivation performance obtained in embodiment 1. In fact, as in the comparative example shown in sample #6, sufficient passivation performance cannot be obtained when only the first hydrogen plasma treatment is performed after the formation of the first titanium dioxide film (film thickness: 1.5 nm), and it is confirmed that stacking the second titanium dioxide film is effective.

One of the reasons for the insufficient passivation performance can be considered as follows. A titanium dioxide film with a film thickness of 1.5 nm is too thin to completely cover the surface of the crystalline silicon layer, even by the atomic layer deposition (ALD) method. For example, the titanium oxide film may have a defect like a pinhole, and the titanium oxide film may have a part that does not cover the crystalline silicon layer.

Another reason may be such that a too small film thickness of the titanium oxide film may affect the formation of an interlayer film. In other words, almost only an interlayer film may have been formed at this film thickness. Therefore, the chemical composition of the passivation film is not appropriate for improving the passivation properties, and as a result, the formation of fixed charges and the hydrogen content may become insufficient.

The passivation properties of sample #4 are further improved by performing the second hydrogen plasma treatment in addition to the first hydrogen plasma treatment. In fact, using the steps performed in the samples #3 and #4 for forming a hole selective film in embodiment 1 improves the hole selectivity and passivation properties of the titanium oxide film, thereby obtaining an open circuit voltage higher than that obtained in embodiment 1. The fill factor and hence the conversion efficiency, however, decrease due to the increase in electrical resistance caused by the increase in oxygen concentration in the interlayer film after annealing. From the foregoing, the titanium dioxide film in the present embodiment 3 is preferably applied not as a hole selective film but as a second passivation film in a back surface electrode solar cell as illustrated in FIG. 19 where hole selectivity is not required but passivation properties are required.

Modification

For example, the combination of titanium oxide film 11 and light transmissive electrode 13 illustrated in FIG. 16 may be used in place of non-passivation hole selective film 52 illustrated in FIG. 19. In this case, first passivation film 50 is not required at the interface between titanium oxide film 11 and crystalline silicon layer 10. This is because the hole selective film composed of the combination of titanium oxide film 11 and light transmissive electrode 13 also has suitable passivation properties.

While the invention made by the present inventors has been specifically described based on the preferred embodiments, it is not intended to limit the present invention to the above-described preferred embodiments but the present invention may be further modified within the scope and spirit of the invention defined by the appended claims.

For example, the above embodiments describe examples for applying a titanium oxide film that is formed by the production method in embodiment 1 to a hole selective film of a carrier selective solar cell or a contact film of a semiconductor device. A titanium oxide film formed by the production method in embodiment 1 is not limited to those examples, and can be applied to, for example, as a photoelectrode for water splitting. The description above shows that the titanium oxide film formed by the production method in embodiment 1 has a wide range of applications and is technically useful.

(Additional note 1) A solar cell including: a light absorber having a first surface and a second surface; a hole selective film which is directly formed on the first surface and which selectively allows holes to pass through; and an electron selective film which is directly formed on the second surface and which selectively allows electrons to pass through, in which the hole selective film is a titanium oxide film, and has the same passivation properties as that of the electron selective film.

(Additional note 2) A semiconductor device including a semiconductor layer and a plug to be connected to the semiconductor layer, in which the plug includes a contact film that is in direct contact with the semiconductor layer, the contact film includes a hole selective film that selectively allows holes to pass through, and the hole selective film is a titanium oxide film.

(Additional note 3) A method for producing a semiconductor device, the method including the steps of (a) forming a first titanium oxide film on a crystalline silicon layer by a thermal atomic layer deposition method; (b) performing first hydrogen plasma treatment on the first titanium oxide film; and (c) after the step (b), forming a second titanium oxide film on the first titanium oxide film by the thermal atomic layer deposition method.

(Additional note 4) The method for producing a semiconductor device according to the additional note 3, in which the film thickness of the first titanium oxide film is smaller than the film thickness of the second titanium oxide film.

(Additional note 5) The method for producing a semiconductor device according to the additional note 3, further including a step (d) performing second hydrogen plasma treatment on the second titanium oxide film after the step (c).

(Additional note 6) The method for producing a semiconductor device according to any one of the additional notes 3 to 5, in which the semiconductor device includes a solar cell including a passivation film composed of the first titanium oxide film and the second titanium oxide film.

(Additional note 7) A semiconductor device including a crystalline silicon layer having a main surface; an interlayer film which is provided on the main surface and which contains silicon, titanium, and oxygen; a first titanium oxide film provided on the interlayer film; and a second titanium oxide film provided on the first titanium oxide film, in which the interlayer film further contains 1.5 atomic % or more of hydrogen.

(Additional note 8) The semiconductor device according to the additional note 7, in which the film thickness of the first titanium oxide film is smaller than the film thickness of the second titanium oxide film.

(Additional note 9) The semiconductor device according to the additional note 7, in which the semiconductor device includes a solar cell.

(Additional note 10) The semiconductor device according to the additional note 9, in which the solar cell is a back surface electrode solar cell including an anode electrode and a cathode electrode provided on the back surface side opposite to the front surface that is a light incident surface; and the back surface electrode solar cell includes on the front surface side thereof a passivation film including the first titanium oxide film and the second titanium oxide film.

Acknowledgments

"A part of this study was conducted at the Nano-Processing Facility of the National Institute of Advanced Industrial Science and Technology with the support of the "Nanotechnology Platform Program" of the Ministry of Education, Culture, Sports, Science and Technology."

REFERENCE SIGNS LIST

1S Semiconductor substrate
10 Crystalline silicon layer
11 Titanium oxide film
12 Electron selective film
13 Light transmissive electrode
13' Second light transmissive electrode
14 Metal electrode
15 Passivation film
20 Crystalline silicon layer
21 Interlayer film
22 Titanium oxide film
23 Light transmissive electrode
30 Contact film
50 First passivation film
51 Non-passivation electron selective film
52 Non-passivation hole selective film
53 Cathode electrode
54 Anode electrode
55a First titanium oxide film
55b Second titanium oxide film
60 Second passivation film
100, 200, 300, 400, 500 Carrier selective solar cell
600 p-channel field effect transistor
700 Back surface electrode solar cell
CF Conductor film
CNT Contact hole
DR Drain region
GE Gate electrode
IL Interlayer insulating film
SR Source region

What is claimed is:

1. A semiconductor device, comprising:
a crystalline silicon layer having a first main surface and a second main surface which is opposite of the first main surface;
a hole selective film provided on the first main surface or the second main surface;
a light transmissive electrode provided on the hole selective film; and
an electron selective film provided on the second main surface;
wherein the hole selective film includes:
an interlayer film provided on the first main surface or the second main surface and containing silicon, titanium, oxygen, and 1.5 atomic % or more of hydrogen; and
a titanium oxide film provided on the interlayer film.

2. The semiconductor device according to claim 1, wherein:
an oxygen concentration is 45 atomic % or less at a predetermined depth in the interlayer film,
a silicon concentration is 36 atomic % or more at the predetermined depth in the interlayer film, and
the predetermined depth in the interlayer film is defined as a depth where a ratio of the titanium atomic % concentration in the interlayer film to the maximum titanium atomic % concentration in the titanium oxide film is 0.5.

3. The semiconductor device according to claim 1, wherein:
a combined film thickness of the interlayer film and the titanium oxide film is larger than 3 nm and smaller than 8 nm.

4. The semiconductor device according to claim 1, wherein:
a texture structure composed of a faceted surface is formed on the first main surface.

5. The semiconductor device according to claim 1, wherein:
a combination of the interlayer film and the titanium oxide film has hole selectivity for selectively allowing holes in the crystalline silicon layer to pass through, and
passivation for suppressing recombination of electrons and holes on the first main surface or the second main surface.

6. The semiconductor device according to claim 1, wherein:
the semiconductor device is a solar cell.

7. The semiconductor device according to claim 6, wherein:
the solar cell includes
a light absorber including the crystalline silicon layer,
the hole selective film that selectively allows holes generated in the light absorber to pass through, and
the electron selective film that selectively allows electrons generated in the light absorber to pass through.

8. The semiconductor device according to claim 7, wherein:
the light transmissive electrode is light transmissive for at least visible light.

9. The semiconductor device according to claim 1, wherein:
the crystalline silicon layer is an n-type silicon layer.

10. A method for producing the semiconductor device of claim 1, the method comprising:
(a) forming the titanium oxide film on the crystalline silicon layer by a thermal atomic layer deposition method; and
(b) performing hydrogen plasma treatment on the titanium oxide film.

11. The method for producing the semiconductor device according to claim 10, the method further comprising:
(c) forming the light transmissive electrode on the titanium oxide film; and
after the forming (c) of the light transmissive electrode, (d) performing heat treatment in an atmosphere containing oxygen.

12. The method for producing the semiconductor device according to claim 11, wherein:
the light transmissive electrode is light transmissive for at least visible light.

13. The method for producing the semiconductor device according to claim 10, the method further comprising:
before the forming (a) of the titanium oxide film, forming a texture structure on a surface of the crystalline silicon layer.

14. The semiconductor device according to claim 6, wherein
the solar cell has a conversion efficiency of 18% or more.

15. The semiconductor device according to claim 6, wherein:
the solar cell has no amorphous silicon buffer layer between the crystalline silicon layer and the interlayer film.

16. The semiconductor device according to claim 2, wherein:

a combination of the interlayer film and the titanium oxide film has
- hole selectivity for selectively allowing holes in the crystalline silicon layer to pass through, and
- passivation for suppressing recombination of electrons and holes on the first main surface or the second main surface.

17. The semiconductor device according to claim 3, wherein:
a combination of the interlayer film and the titanium oxide film has
- hole selectivity for selectively allowing holes in the crystalline silicon layer to pass through, and
- passivation for suppressing recombination of electrons and holes on the first main surface or the second main surface.

18. The semiconductor device according to claim 4, wherein:
the semiconductor device is a solar cell.

19. The semiconductor device according to claim 5, wherein:
the semiconductor device is a solar cell.

20. The semiconductor device according to claim 1, wherein the electron selective film includes a titanium oxide film or an amorphous silicon film containing hydrogen.

* * * * *